US012431915B2

(12) United States Patent
Wen et al.

(10) Patent No.: US 12,431,915 B2
(45) Date of Patent: Sep. 30, 2025

(54) ADAPTIVE CHARGE MEASUREMENT CIRCUIT FOR DATA CONVERTERS

(71) Applicant: Obsidian Sensors, Inc., San Diego, CA (US)

(72) Inventors: Bing Wen, San Diego, CA (US); John Hong, San Diego, CA (US); Edward Chan, San Diego, CA (US)

(73) Assignee: Obsidian Sensors, Inc., San Diego, CA (US)

(*) Notice: Subject to any disclaimer, the term of this patent is extended or adjusted under 35 U.S.C. 154(b) by 118 days.

(21) Appl. No.: 18/269,247

(22) PCT Filed: Dec. 28, 2021

(86) PCT No.: PCT/US2021/065303
§ 371 (c)(1),
(2) Date: Jun. 22, 2023

(87) PCT Pub. No.: WO2022/146979
PCT Pub. Date: Jul. 7, 2022

(65) Prior Publication Data
US 2024/0056094 A1 Feb. 15, 2024

Related U.S. Application Data

(60) Provisional application No. 63/132,309, filed on Dec. 30, 2020.

(51) Int. Cl.
*H03M 3/00* (2006.01)
(52) U.S. Cl.
CPC ............. *H03M 3/46* (2013.01); *H03M 3/496* (2013.01)

(58) Field of Classification Search
CPC .......... H03M 3/30; H03M 3/46; H03M 3/494; H03M 3/496
See application file for complete search history.

(56) References Cited

U.S. PATENT DOCUMENTS

| | | | |
|---|---|---|---|
| 5,659,315 A | 8/1997 | Mandl | |
| 6,243,034 B1* | 6/2001 | Regier | H03M 1/145 341/166 |

(Continued)

OTHER PUBLICATIONS

Request for the Submission of an Opinion received in KR20237025443, dated May 2, 2025, in 11 pages (with translation).

*Primary Examiner* — Lam T Mai
(74) *Attorney, Agent, or Firm* — Procopio, Cory, Hargreaves & Savitch LLP

(57) ABSTRACT

Data converter circuits and methods of operating the data converter circuits are disclosed. In some embodiments, a data converter circuit includes a charge measurement circuit. In some embodiments, the charge measurement circuit is a capacitive transimpedance amplifier (CTIA). In some embodiments, the data converter circuit includes the CTIA, a quantizer, a digital-to-analog converter, a summer, and a digital filter. In some embodiments, the data converter circuit includes an analog-to-digital converter electrically coupled to the CTIA and the digital filter. In some embodiment, a method includes integrating an input signal with a CTIA, determining whether a CTIA output signal is greater than a threshold, and reducing the CTIA output signal or forgoing the reducing based on the determination of whether the CTIA output signal is greater than the threshold.

19 Claims, 6 Drawing Sheets

(56) References Cited

U.S. PATENT DOCUMENTS

| | | | | |
|---|---|---|---|---|
| 7,339,512 B2* | 3/2008 | Gulati | .................... | H03M 1/168 |
| | | | | 341/172 |
| 8,969,781 B2* | 3/2015 | Hassibi | ................ | G01N 21/763 |
| | | | | 250/214 R |
| 9,998,131 B1* | 6/2018 | Kinyua | ............... | H03F 3/45237 |
| 11,005,495 B1* | 5/2021 | Veeder | ................. | H03M 3/368 |
| 11,929,756 B2* | 3/2024 | Liu | ..................... | H03M 1/1061 |
| 2012/0235846 A1* | 9/2012 | Zhao | ........................ | H03M 1/06 |
| | | | | 341/158 |
| 2014/0001341 A1* | 1/2014 | Hassibi | ..................... | H03F 3/08 |
| | | | | 250/208.2 |
| 2014/0318958 A1* | 10/2014 | Hassibi | .............. | G01N 27/3277 |
| | | | | 204/403.01 |
| 2016/0118992 A1 | 4/2016 | Milkov | | |
| 2020/0343905 A1* | 10/2020 | Shu | ........................ | H03M 3/458 |
| 2023/0327680 A1* | 10/2023 | Xu | ........................ | H03M 1/468 |
| 2024/0264003 A1* | 8/2024 | Ataei | ..................... | H03M 3/47 |
| 2024/0322837 A1* | 9/2024 | Prasad | .................. | H03M 1/468 |

* cited by examiner

ADAPTIVE CHARGE MEASUREMENT CIRCUIT FOR DATA CONVERTERS

CROSS REFERENCE TO RELATED APPLICATIONS

This application is a national stage application under 35 U.S.C. § 371 of International Application No. PCT/US2021/065303, filed internationally on Dec. 28, 2021, which claims benefit of U.S. Provisional Application No. 63/132,309, filed Dec. 30, 2020, the entire disclosures of which are herein incorporated by reference for all purposes.

FIELD

This disclosure generally relates to data converters. More specifically, this disclosure relates to data converters including a charge measurement circuit such as a capacitive transimpedance amplifier (CTIA).

BACKGROUND

A column of a sensor array (e.g., X-ray panel) may include a large parasitic capacitance and/or a large parasitic resistance. Depending on the distance from a pixel to a readout circuit input and/or the pixel resistance, the parasitic resistance may be in a range of several ohms to five kilo-ohms. Variations of pixel and column parameters (e.g., for different sensor arrays) may affect the dynamics of charge transfer (e.g., transient waveform differences associated with a same total charge).

A CTIA may be a charge measurement circuit used to convert charge from the sensor to a voltage value. An advantage of using a CTIA for this purpose is that the DC level of the CTIA output voltage is a function of a total input charge during an integration period. Noise from circuit components will add noise to the CTIA output voltage, but, other than the offset noise of the CTIA, the DC level is not affected by the noise from circuit components. The column may be connected to a CTIA that is configured to transfer charge of a selected sensor pixel from the column onto the CTIA's feedback capacitor.

In some instances, the capacitance of the feedback capacitor may need to be large enough to store the charge transferred from the pixel. This capacitance may be large (e.g., in the pF range), requiring a large area of chip to be occupied by the feedback capacitor(s); if a CTIA is required for each column, the number of feedback capacitors is the number of columns of the sensor array (e.g., for a 500 column array, 500 pF area of capacitors is required). Furthermore, because the capacitance value may be large, a corresponding output voltage may be low (e.g., due to the Q=CV relationship), requiring subsequent circuitry (e.g., an analog-to-digital converter (ADC)) to have higher resolution or sensitivity. In some examples, the CTIA may be configured for variable gain by including different values of feedback capacitors, which further increases the area of the chip.

In some examples, because a particular feedback capacitor size may be suitable for one sensor array size, one kind of pixel, and/or one dynamic range, different CTIA designs may be needed for different sensor array sizes, different kinds of pixels, and/or different dynamic ranges, increasing cost for designing specific readout circuits for different systems.

Additionally, charge integration time and signal digitization time may not overlap. To reduce the time spent on readout of each row of sensors, a sample and hold circuit may be included to allow simultaneous integration of charge from a first row and digitizing charge from a second row, requiring one or two more capacitors (in addition to the feedback capacitors). The additional capacitors may be as large as the feedback capacitor to reduce noise (e.g., Johnson noise). The additional capacitors further add area to the chip and limit the chip's ability to be used for different array sizes, different kinds of sensors, or different dynamic ranges.

SUMMARY

Data converter circuits and methods of operating the data converter circuits are disclosed. In some embodiments, a data converter circuit includes a charge measurement circuit. In some embodiments, the charge measurement circuit is a capacitive transimpedance amplifier (CTIA). In some embodiments, the data converter circuit includes the CTIA, a quantizer, a digital-to-analog converter, a summer, and a digital filter. In some embodiments, the data converter circuit includes an analog-to-digital converter electrically coupled to the CTIA and the digital filter. In some embodiment, a method includes integrating an input signal with a CTIA, determining whether a CTIA output signal is greater than a threshold, and reducing the CTIA output signal or forgoing the reducing based on the determination of whether the CTIA output signal is greater than the threshold.

In some embodiments, a circuit includes: an analog input, a charge transimpedance amplifier (CTIA) electrically coupled to the analog input, a quantizer electrically coupled to an output of the CTIA, a digital-to-analog converter (DAC) electrically coupled to an output of the quantizer, a summer electrically coupled to an output of the DAC. The CTIA is electrically coupled to an output of the summer, a digital filter electrically coupled to the output of the quantizer, and a digital output electrically coupled to the digital filter. In some embodiments, the circuit allows the CTIA to be advantageously integrated adaptively. As a result, a larger capacitor configured to store the entirety of the sensor charge may no longer be required, and the circuit may read out sensors from different array sizes, read out different kinds of sensors, or used at different dynamic ranges.

In some embodiments, a method includes: integrating, with a CTIA of a circuit, an input signal; determining whether a CTIA output signal at the output of the CTIA is greater than a threshold; in accordance with a determination that the CTIA output signal is greater than the threshold: reducing the CTIA output signal; and in accordance with a determination that the CTIA output signal is not greater than the threshold: forgoing reducing the CTIA output signal. In some embodiments, a non-transitory computer readable storage medium stores one or more programs, and the one or more programs include instructions, which when executed by an electronic device with one or more processors and memory, cause the device to perform the method.

In some embodiments, the method allows the CTIA to be advantageously integrated adaptively. As a result, a larger capacitor configured to store the entirety of the sensor charge may no longer be required for the circuit, and the circuit may read out sensors from different array sizes, read out different kinds of sensors, or used at different dynamic ranges.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Figure 1:
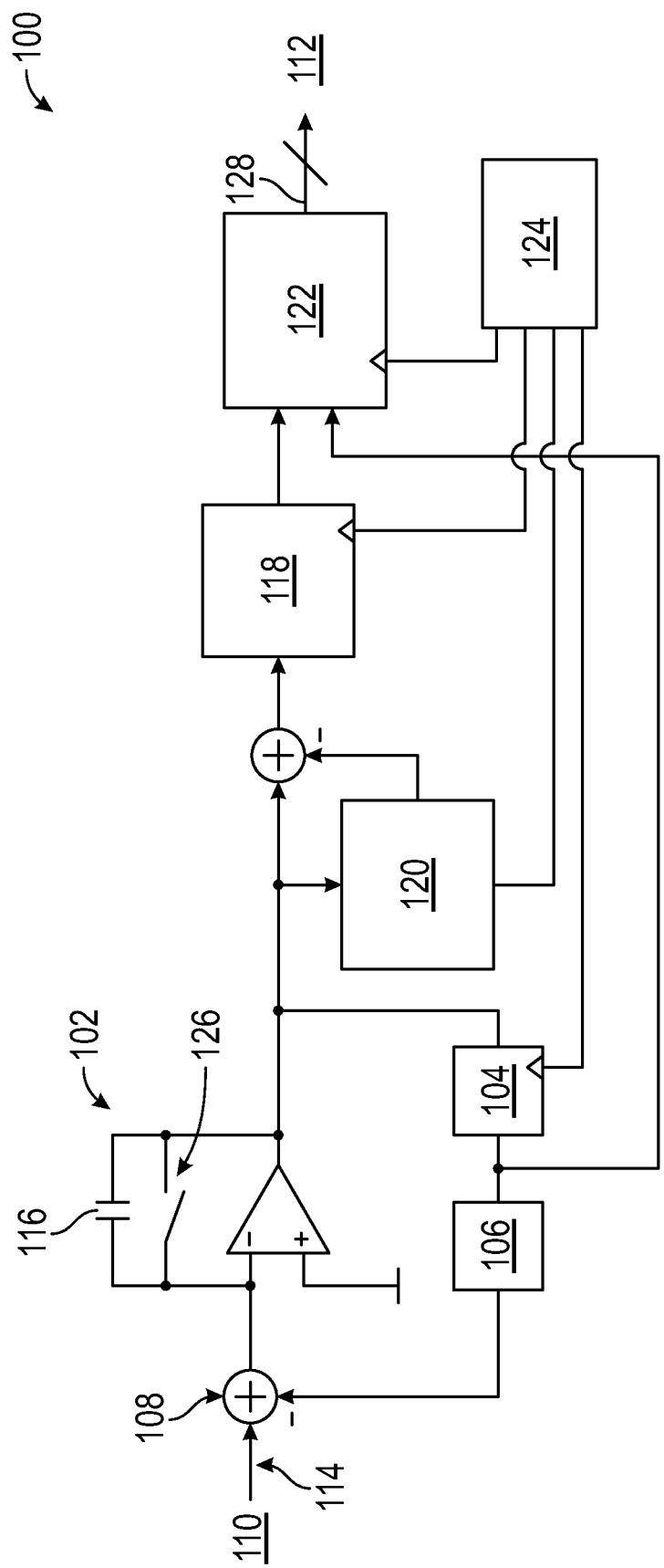
FIG. 1 illustrates an exemplary circuit, according to embodiments of this disclosure.

FIG. 1 illustrates an exemplary circuit 100, according to embodiments of this disclosure. In some embodiments, the circuit 100 is a data converter and includes CTIA 102, a quantizer 104 electrically coupled to an output of the CTIA, a digital-to-analog converter (DAC) 106 electrically coupled to an output of the quantizer, and a summer 108 electrically coupled to an output of the DAC and the CTIA. In some embodiments, the circuit 100 is configured to generate a digital output signal 112 (e.g., provided at digital output 128) corresponding to an input signal 110 at the input 114 of the circuit. For example, the input 114 is an analog input, and the digital output signal 112 is the converted digital value of the analog input.

Although examples of the disclosure are described with respect to CTIA, it is understood that the disclosed circuits are not limited to using a CTIA to process an input. For example, the disclosed circuits and methods may use a different kind of integrating amplifier or current-to-voltage converter to process the input. As another example, more generally, the disclosed circuits and methods may use a different charge measurement circuit to process the input. In some embodiments, in lieu of a CTIA 102, the circuit 100 includes a charge measurement circuit (not shown). For example, the charge measurement circuit receives a charge at its input (e.g., electrically coupled to input 114) and generates, at its output (e.g., electrically coupled to the quantizer 104), a signal reflecting an amount of the charge.

For example, the input signal 110 is an analog signal, and the digital output signal 112 is a digital representation of the input signal 110. In some embodiments, the digital output signal 112 represents an analog sensor readout value (e.g., a sensor charge, a sensor voltage, a sensor current), and the digital output signal 112 is provided to another part of a sensor system for further processing.

In some embodiments, the digital output signal 112 is a digital value of a charge at the input 114 of the circuit (e.g., the circuit 100 is configured for charge sensing). In some embodiments, the digital output signal 112 is a digital value of a current at the input 114 of the circuit (e.g., the circuit 100 is configured for current sensing by measuring an input charge over time or integrating an input charge). In some embodiments, the digital output signal 112 is a digital value of a voltage at the input 114 of the circuit (e.g., the circuit 100 is configured for voltage sensing). For example, to configure the circuit 100 for voltage sensing, a voltage-to-current converter is electrically coupled to the CTIA 102. It is understood that the digital output signal 112 may correspond to other electrical quantity at the input 114 of the circuit 100.

In some embodiments, when the circuit 100 is configured for current sensing or voltage sensing (e.g., for sensing a steady current or a steady voltage), the circuit 100 is operating as a multi-stage noise-shaping (MASH) modulator. For example, the circuit 100 operates may operate as a MASH to measure a steady current (e.g., in contrast to a transient current or a signal current of shorter duration from a sensor, which may include greater signal transitions; a noise current). In some embodiments, while the circuit is operating as a MASH, to prevent accumulating switching noise, the quantizer is turned off when the input signal is low enough to no longer saturate the feedback capacitor (e.g., while the circuit is operating as a MASH, integration of the input signal does not saturate the feedback capacitor). Meanwhile, the pixel remains connected, so thermal noise can be reduced (e.g., the average noise is reduced) by the ADC.

In some embodiments, the CTIA 102 includes a feedback capacitor 116, the input 114 of the circuit is configured to be electrically coupled to a sensor (e.g., a bolometer pixel, an X-ray sensor pixel, a visible imaging sensor pixel, an infrared imaging sensor pixel, a MEMS sensor pixel, a sensor pixel that converts information about an environment into an electrical signal), and a capacitance of the feedback capacitor is smaller than a capacitance of the sensor. As an example, the capacitance of the sensor pixel is 2.6 pF, and the capacitance of the feedback capacitor 116 is 0.5 pF. In some embodiments, the capacitance of the feedback capacitor 116 is determined such that the feedback capacitor 116 does not saturate during integration, as described in more detail herein. Exemplary methods of sensor readout can be found in International Application Publication No. WO2019204515 and WO2020033930, the disclosures of which are incorporated herein by reference in their entireties for all purposes.

In some embodiments, the input signal 110 is integrated using circuit 100. That is, using the elements of circuit 100 and/or the disclosed methods of operating the circuit, the CTIA 102 integrates portions of the signal 110 (e.g., a charge of a sensor electrically coupled to the CTIA) during different times of integration, which will be described in more detail herein. In some embodiments, after a portion of the signal has been integrated, if the output of the CTIA is greater than a threshold, the charge on the CTIA is reduced by a value (e.g., such as by subtracting, from the CTIA output signal, a fixed value 214). By integrating portions of the input signal at different times and reducing the CTIA output by a value after integrating a portion, the CTIA is allowed to advantageously integrate adaptively. As a result, a larger capacitor configured to store the entirety of the sensor charge may no longer be required. Furthermore, as described in more detail herein, because the CTIA is allowed to integrate adaptively, timing of the integration (e.g., timing of quantizer decision times, timing of feedback times, number of quantizer decision times, number of feedback times) may be adjusted (e.g., for different input signal levels, for different sensitivity or resolution, for different CTIA gain), advantageously allowing the circuit 100 to be used for a broader range of input (e.g., different kinds of sensors, different sensor array configurations, different dynamic ranges).

As an exemplary advantage, the disclosed circuit and methods of operating the circuits may, when compared to a feedback capacitor of a conventional CTIA, allow the feedback capacitance value to be smaller. For example, integration of output waveform 204 does not include integrating portions of the input signal at different times and reducing the CTIA output by a value after integrating a portion. The CTIAs described herein (e.g., CTIA 102, CTIA 402, circuit 500, circuit 600) with a smaller feedback capacitor may be able to integrate a same input as a conventional CTIA, but without the bigger feedback capacitor. Accordingly, a corresponding output voltage of CTIAs disclosed herein may be higher (e.g., due to the Q=CV relationship), relaxing the resolution or sensitivity requirements of subsequent circuitry (e.g., an ADC). As another exemplary advantage, because the CTIA is allowed to integrate adaptively, the disclosed circuits and methods of operating the circuits may accommodate readout of different array sizes, different kind of pixels, and/or different dynamic ranges. This can reduce a need for different CTIA designs and reduce cost for designing specific readout circuits.

For example, a circuit may have a maximum allowable analog voltage of 3 V and a sensor pixel (e.g., an X-ray sensor pixel) with maximum charge of 8 pC and a capacitance of 2.6 pF. The conventional CTIA may additionally require a correlated double sampler, which requires two additional capacitors having a same value as the capacitance of the sensor pixel. For this exemplary system, a data converter circuit that uses conventional CTIAs requires about 8 pF (e.g., three times 2.6 pF for the feedback capacitor and the two capacitors for correlated double sampling) of capacitance per channel.

In contrast, using a data converter circuit that uses the disclosed CTIAs (e.g., CTIA 102, CTIA 402, circuit 500, circuit 600) for this exemplary system instead, a 0.5 pF feedback capacitor may be used for the CTIA and a second 0.5 pF capacitor (e.g., offset removal capacitor 506, offset removal capacitor 610) may be used for offset removal, meaning 1 pF of capacitance is required per channel. For this exemplary system, using a data converter circuit that includes the disclosed CTIAs, a capacitor area can be reduced by a factor of eight.

Furthermore, because the feedback capacitor of CTIAs described herein may not saturate while being integrated, the smaller 0.5 pF feedback capacitor may be used to integrate charge beyond the conventional CTIA's feedback capacitor's capacity of 2.6 pF. In some embodiments, an effective capacitance of the CTIA feedback capacitor (e.g., feedback capacitor 116, feedback capacitor 416, feedback capacitor 516, feedback capacitor 616) (e.g., corresponding to a total number of charge that the CTIA feedback capacitor can integrate during integration described herein) may be determined based on the clock that controls the quantizer (e.g., quantizer 104, quantizer 404). For example, if there are $N_1$ cycles available for use by the CTIA (e.g., there are $N_1$ number quantizer decision times 210 during integration, there are $N_1$ number feedback times 212 during integration), the effective capacitance of the CTIA feedback capacitor is $N_1 \times$(capacitance of the CTIA feedback capacitor). In some embodiments, the number $N_1$ is determined based on a total number of oversampling ratio (OSR) clock cycles N and on how the N clock cycles are allocated between the integration time (e.g., integration 308) and the residue conversion (e.g., residue conversion portion of residue conversion and FIR output 310). As an example, $N_1$=16, the effective capacitance of the CTIA feedback capacitor is 16×0.5 pF=8 pF, meaning that, a CTIA including a 0.5 pF feedback capacitor may have three times the charge capacity, compared to a conventional CTIA that includes a 2.6 pF feedback capacitor.

Furthermore, because the CTIA is allowed to integrate adaptively, the CTIA (e.g., CTIA 102, CTIA 402, circuit 500, circuit 600) may be configured for variable gain by varying integration time, reducing a need for additional feedback capacitors for different gains. Additionally, by integrating as described, portions of the input may be converted at a same time (e.g., a first portion of the input is converted after being integrated while a second portion of the input is being integrated), reducing a need for sample and hold circuits and additional capacitors without reducing conversion speed.

The area efficiency and flexibility of the disclosed circuits may be advantageously suited for arrayed sensors such as X-ray sensors, bolometers, visible imaging sensors, infrared imaging sensors, and MEMS sensors, where sets of signals may be readout and converted to digital form. Without changing the hardware, the disclosed circuits advantageously can be configured to convert data for different array sizes, different kind of sensors, or different dynamic ranges (e.g., by adjusting integration time) while, at least, maintaining an accuracy of a corresponding data conversion circuit that conventionally integrates.

As yet another exemplary advantage, the effects of thermal noise (e.g., from sensor column parasitic capacitance) on the disclosed circuits may be lower due to the Sigma-Delta oversampling (e.g., by integrating, as described herein; by using a Sigma-Delta converter for ADC 118) performed by the disclosed circuits, compared to a higher bandwidth sample and hold circuit used to capture an output of a conventional CTIA.

In some embodiments, the CTIA 102 includes a reset switch 126 electrically coupled in parallel with the feedback capacitor 116. In some embodiments, before a sensor pixel begins transferring charge to the CTIA (e.g., during feedback capacitor reset 302 time), the feedback capacitor 116 is reset by the reset switch 126, which is closed (e.g., during feedback capacitor reset 302 time) to clear remaining charge on the feedback capacitor (e.g., reset the value of the output of the CTIA (e.g., leaving an offset value at the output)).

In some embodiments, the quantizer 104 is configured to determine whether a CTIA output signal at the output of the CTIA is greater than a threshold. In accordance with a determination that the CTIA output signal is greater than the threshold, the quantizer 104 outputs a first digital value (e.g., to the DAC 106, to the finite impulse response (FIR) decimator 122). In accordance with a determination that the CTIA output signal is not greater than the threshold, the quantizer 104 outputs a second digital value (e.g., to the DAC 106, to the FIR decimator 122). In some embodiments, during integration, the output of the quantizer 104 outputs a binary sequence (e.g., quantizer output waveform 208) based on the quantizer comparison results.

In some embodiments, the threshold is set to provide margin or headroom for the integrator output voltage. For example, the threshold would prevent the CTIA 102 from saturating while the amplifier's dynamic range is utilized effectively (e.g., the threshold does not cause a reduction of the input signal too early).

In some embodiments, the threshold is set based on the capacitance of the feedback capacitor 116. For example, the threshold value is less than a level corresponding to a charge storage capacity of the feedback capacitor 116. In some embodiments, the threshold of the quantizer 104 is adjustable based on the input electrically coupled to the circuit 100, allowing the circuit 100 to be used for different sensor array sizes, different kinds of sensors, and/or different dynamic ranges.

In some embodiments, the quantizer 104 is a comparator. In some embodiments, the quantizer 104 makes the comparison between the output of the CTIA and the threshold during quantizer decision time of integration, as described in more detail herein.

As an example, during a quantizer decision time, the quantizer 104 compares an output of the CTIA 102 to the threshold. If the output level of the CTIA 102 is greater than the threshold, then the quantizer 104 outputs a "high" signal to the DAC 106, and if the output level is not greater than the threshold, then the quantizer 104 outputs a "low" signal to the DAC 106.

In some embodiments, the DAC 106 is configured to output a high DAC output signal (e.g., a signal that causes the CTIA output signal to be reduced by a value (e.g., fixed value 214) during integration) to the summer 108 in response to receiving the first digital value from the quantizer 104. In some embodiments, the high DAC output signal is the value (e.g., the high DAC output signal is a charge corresponding to the value (e.g., a charge corresponding to a voltage being reduced) that reduces the charge from the feedback capacitor to cause the CTIA output level to be reduced by the value). In response to receiving the second digital value, the DAC 106 forgoes outputting the high DAC output signal to the summer 108. For example, if the quantizer 104 outputs a "high" signal to the DAC 106, then the DAC 106 outputs the high DAC output signal to the summer 108. If the quantizer 104 outputs a "low" signal to the DAC 106, then the DAC 106 forgoes outputting the high DAC output signal to the summer 108.

As an example, the CTIA output voltage ranges between 0 V to 3.3 V (e.g., analog voltage rail is 3.3 V). The threshold value of the quantizer can be set at 2.8 V, and the value is 2.3 V. That is, in accordance with a determination that the CTIA output voltage is greater than the threshold, the DAC outputs the high DAC output signal, and in response to the high DAC output signal being outputted, the circuit causes the output voltage to decrease by 2.3 V. It is understood that these values are merely exemplary, and different output voltage values, quantizer threshold values, and DAC output values may be set.

In some embodiments, if the quantizer 104 outputs a "low" signal to the DAC 106, the DAC 106 ceases providing an output. As an exemplary advantage, by ceasing providing an output when the quantizer 104 outputs a "low" signal to the DAC 106, noise charge (e.g., from charge injection) may be minimized if the quantizer 104 outputs a "low" signal to the DAC 106.

In some embodiments, the CTIA 102 includes a feedback capacitor 116, and the feedback capacitor 116 is configured to store a total charge. The CTIA output signal is reduced by a value (e.g., fixed value 214) corresponding to a charge less than the total charge that the feedback capacitor 116 is configured to store. For example, the value by which the CTIA output signal is being reduced (e.g., fixed value 214) is a quantity less than a difference between a voltage level corresponding to a charge storage capacity of the feedback capacitor 116 and the threshold level of the quantizer 104.

In some embodiments, the quantizer 104 and the DAC 106 are combined into one component. For example, the combined quantizer and DAC is configured to output the results of the comparison between the output of the CTIA and the threshold and the high DAC output signal.

In some embodiments, the summer 108 is configured to cause the output signal of the CTIA 102 to be reduced by a value (e.g., fixed value 214) corresponding to the high DAC output signal in response to receiving the high DAC output signal from the DAC 106. For example, an amount corresponding to the value (e.g., fixed value 214) is reduced from the CTIA output after a portion of the input signal is integrated (e.g., as illustrated by CTIA waveform 206). Portions of the input signal are integrated at different times. An amount corresponding to the value is reduced whenever the integrated portion (e.g., the CTIA output) exceeds the threshold of the quantizer 104, preventing the feedback capacitor 116 from saturating. As described in more detail herein, the portions of the input signal are integrated and the output of the CTIA is reduced in this manner until a last portion of the input signal below the threshold level of the quantizer 104 remains, which is the residue (e.g., a residue charge, a residue voltage, residue 216) of the CTIA 102.

In some embodiments, the summer 108 is electrically coupled to a terminal of the feedback (e.g., at an input of the CTIA, at an output of the CTIA) capacitor 116 and reduces the CTIA output signal by reducing the voltage at the terminal. In some embodiments, the summer 108 is electrically coupled to additional circuit components, and in response to receiving a signal from the summer 108 to reduce the CTIA output signal, these additional circuit components reduce the CTIA output signal.

Although the summer 108 is illustrated as shown in FIG. 1, it is understood that the illustration is merely exemplary. The summer 108 may be electrically coupled differently than illustrated. For example, the summer 108 may be electrically coupled to the output of the CTIA to subtract the value from the output of the CTIA.

In some embodiments, the circuit 100 includes an ADC 118 electrically coupled to the output of the CTIA 102. The ADC 118 is configured to receive a voltage corresponding to a residue voltage or residue charge at the output of the CTIA 102 and generate a digital value corresponding to the residue voltage or residue charge. In some embodiments, the digital output signal 112 includes the digital value corresponding to the residue (e.g., the digital value of the residue voltage or residue charge and a binary sequence generated from the quantizer output are processed (e.g., by the FIR decimator 122) to generate the digital output signal 112). In some embodiments, the ADC 118 is a Sigma-Delta ADC.

In some embodiments, a voltage corresponding to the residue charge (e.g., a voltage of CTIA output 206 near an end of integration, residue voltage, residue 216) is less than a threshold of the quantizer 104 (e.g., threshold 218). For example, portions of the input signal are integrated and reduced in the described manner until a portion of the input signal below the threshold level of the quantizer 104 remains near an end of integration, which is the residue voltage or residue charge of the CTIA 102. The ADC 118 receives a voltage corresponding to the residue charge and converts the residue voltage or residue charge into a digital signal, which is provided an input of the FIR decimator 122, which is described in more detail herein.

In some embodiments, the circuit 100 includes an offset removal circuit 120, and the offset removal circuit is configured to remove an offset from the output of the CTIA 102. For example, the offset removal circuit 120 captures the offset value. The offset value is subtracted from the voltage corresponding to the residue charge or the residue voltage prior to being provided to the ADC 118, removing the offset from the digital output signal 112 and improving the data conversion accuracy of the circuit 100.

In some embodiments, the offset removal circuit 120 is configured for correlated double sampling. After the reset switch 126 resets the feedback capacitor 116 (e.g., after feedback capacitor reset 302), random noise may be sampled. In some embodiments, the capacitance of a sensor column may be large, and the noise may be thermal noise in the parasitic column elements and may cause a random charge value. The standard deviation of this random charge may be approximately equal to $\sqrt{kTC_{data}}$.

In some embodiments, to remove this random noise, the output of the CTIA is measured (e.g., measured multiple times and averaged) by the offset removal circuit 120—once at the start or before the start of integration, measuring the noise charge, and once at the end or after integration completes, measuring an integrated signal or a residue plus the noise charge. The difference of these two measured values (e.g., the difference of these two measured values would exclude the offset) is converted to a digital value using ADC 118 (e.g., a Sigma-Delta converter). For example, without using the disclosed offset removal circuit and methods, the offset is 4 mV. When the disclosed offset removal circuit and methods are used (e.g., offset removal circuit 120, circuit 400, circuit 500, circuit 600), the offset is reduced to 1.5 mV.

In some embodiments, because the CTIA is allowed to integrate adaptively, a sensitivity of the circuit 100 (e.g., resolution) is based on a frequency of operation of the circuit, and the frequency of operation of the circuit is based on an integration time of the CTIA 102. By having sensitivity adjustability based on a frequency of operation, the circuit may be advantageously used for a wider range of applications (e.g., the circuit is suitable for both lower and higher resolution systems).

For example, by increasing the frequency of integration (e.g., reducing a time between the integrations of the first and second portions of the input signal, reducing the timing between quantizer decision times 210 and feedback times 212), the sensitivity of the circuit 100 (e.g., resolution) is increased. Conversely, by decreasing the frequency of integration (e.g., increasing a time between the integrations of the first and second portions of the input signal, increasing the timing between quantizer decision times 210 and feedback times 212), the sensitivity of the circuit 100 (e.g., resolution) is decreased. The relationship between integration time, frequency, and sensitivity of the disclosed circuits is described in more detail with respect to FIGS. 2 and 3.

In some embodiments, the circuit 100 includes a variable resistor (not shown) (e.g., a MOS transistor) electrically coupled to the input of the circuit, and the variable resistor is configured to provide a reduced current level to the input of the circuit and prevent the feedback capacitor from saturating.

For example, a sensor, which stores a charge corresponding to data being sensed, being read out begins to discharge. During this time (e.g., t=0), the resistance of the variable resistor is at an initial resistance (e.g., $R_0$), and the sensor is electrically coupled to the variable resistor. As time progresses during this discharge time, the resistance of the variable resistor decreases from $R_0$. The resistance is decreased linearly from $R_0$ to zero by the end of the discharge time (e.g., t=T, when the sensor complete discharges). In some embodiments, T is the duration of integration 308. In some embodiments, T is the duration of sensor readout 306. In some embodiments, T is a fraction of the duration of sensor readout 306. In some embodiments, the discharge time window is several magnitudes longer than a rise time of a signal turning on a comparable MOS transistor. Therefore, reducing a resistance of the variable resistor over the discharge time window may be different than merely turning on a transistor. For example, the discharge time window is in the microsecond range and a rise time of the signal turning on the MOS transistor is in nanosecond range. The resistance of the variable resistor can be calculated as follows:

$$R(t) = R_0\left(1 - \frac{t}{T}\right) \quad (1)$$

In some embodiments, to control the resistance, a control voltage is electrically coupled to the gate of the MOS variable resistor and increases the drain-to-source transconductance from low to high (i.e., resistance decreases from high to low) (e.g., by increasing the gate voltage) for each row time during readout. As described with the above equation, the resistance of the variable resistor is linearly decreasing from t=0 to t=T; the resistance at t=0 (e.g., R(0)) is $R_0$, the initial resistance, after t=0, the resistance is linearly decreasing as described with respect to the equation, and the resistance (e.g., R(T)) approaches substantially zero at t=T.

Although equation (1) shows that, in an ideal case, R(t) reaches zero at t=T, it is understood that components used to implement the variable resistor may not reach exactly zero resistance at an end of a discharge time window. In some embodiments, this resistance is the variable resistor's lowest resistance. For example, if the variable resistor is a MOS transistor, then the lowest resistance is determined by the conductance of the transistor (e.g., the transistor's "on" resistance).

The capacitance of the sensor can be represented with C. The current going into the variable resistor can be calculated as follows:

$$C\frac{dV}{dt} = -\frac{V}{R(t)} \quad (2)$$

By solving for V(t), the voltage across the variable resistor can be calculated as a function of time:

$$V(t) = V(0)\left[1 - \frac{t}{T}\right]^{\frac{T-CR_0}{CR_0}} \quad (3)$$

The current I(t) across the variable resistor can be expressed as:

$$I(t) = \frac{V(0)\left[1 - \frac{t}{T}\right]^{\frac{T}{CR_0}}}{R_0\left(1 - \frac{t}{T}\right)} = \frac{V(0)\left[1 - \frac{t}{T}\right]^{\frac{T-CR_0}{CR_0}}}{R_0} \quad (4)$$

As shown with equation (4), if the discharge time window T is set to be equal to the initial time constant (e.g., T=C×$R_0$), the current output can be substantially constant (e.g., I=V(0)/$R_0$). Accordingly, in some embodiments, the $R_0$ of the variable resistor is determined by the effective capacitance (e.g., 1-5 pF) of the sensor and the discharge time window (e.g., a time of reading out a row of sensors).

By converting the discharge current to a constant current, peak current associated with a transient sensor readout signal may be reduced, preventing the feedback capacitor 116 from being saturated by a high current.

In some embodiments, instead of varying the resistance of the variable resistor linearly throughout a sensor discharge time, as described above, the resistor (e.g., a MOS transistor) is driven by a two-state voltage. When driven by a first voltage of the two states, the resistor has a low impedance, and when driven by a second voltage of the two states, the resistor has a high impedance. In some embodiments, when a signal associated with an input is at a high level (e.g., due to the transient characteristics of the input signal), the variable resistor is set to have the high impedance by driving the variable resistor with the second voltage. The waveform of the signal may be advantageously reduced, slowing a signal transfer rate (e.g., the rate of charging the feedback capacitor) and preventing the feedback capacitor from being saturated (e.g., reducing a need for a bigger feedback capacitor). After the signal amplitude decreases to a lower level (e.g., due to the transient characteristics of the sensor discharge), the variable resistor is set to have the low impedance by driving the variable resistor with the first voltage to increase the signal transfer rate (e.g., the rate of charging the feedback capacitor).

In some embodiments, the circuit 100 includes a digital filter. In some embodiments, the digital filter is electrically coupled to the output of quantizer 104. It is understood that the digital filter may perform operations in addition to digital filtering. For example, the digital filter is configured to decode the pulse code modulation (PCM) sequences from the quantizer output 104 and/or the ADC 118. As another example, the digital filter is configured to combine the signals from the quantizer output 104 and the ADC 118 to generate a digital output signal 112 at the digital output 128.

In some embodiments, the digital filter includes a FIR decimator 122 (e.g., the FIR decimator 122 is electrically coupled to the output of the quantizer 104), and the FIR decimator 122 is configured to receive signals from the output of the quantizer 104. In some embodiments, the FIR decimator 122 is configured to further receive a digital value corresponding to a residue charge or a residue voltage at the output of the CTIA 102 (e.g., from the ADC 118). For example, the FIR decimator receives signals from the output of the quantizer 104 (e.g., from integrating the CTIA 102, a binary sequence representing the input signal 110, quantizer output waveform 208) or signals from the output of the quantizer 104 (e.g., from integrating the CTIA 102, a binary sequence representing the input signal 110 without the residue, quantizer output waveform 208) and a digital value corresponding to a CTIA residue charge or residue voltage from the ADC 118, filters these inputs, and provides a digital output signal 112 (e.g., at digital output 128) that more accurately represent the input signal 110.

In some embodiments, the FIR decimator combines the output from the CTIA 102 (e.g., representative of the integration result) with the output from the ADC 118 (e.g., representative of the CTIA residue). For example, a set of PCM sequences is created from the CTIA 102 (e.g., the PCM sequence is generated at the output of the quantizer 104 (e.g., quantizer output waveform 208) based on the results of the quantizer) and the ADC 118 outputs for possible input signal 110 levels. A vector matrix equation (e.g., equations (5) and (6)) may be set up. The equation relates the PCM sequences processed by the FIR tap coefficients to be equal to the corresponding analog input signal values. In some embodiments, the input signal is obtained from the output of the CTIA 102 and ADC 118 using the following formula:

$$\mu = g_1(A_1 \times C_1 + g_2 A_2 \times C_2) + \mu_0 \qquad (5)$$

Where: $A_1$ is a PCM sequence of the CTIA 102
$A_2$ is a PCM sequence of the ADC 118
$C_1$ are FIR filter coefficients for the CTIA 102, normalized to a sum of one
$C_2$ are FIR filter coefficients for the SD modulator, normalized to a sum of one
$g_2$ is a weight applied to the ADC PCM sequence (to be added to the CTIA PCM sequence)
$g_1$ is a gain of the digital output signal 112 to the input signal 110
$\mu_0$ is an offset of the digital output signal 112 to the input signal 110

In some embodiments, $\mu$ is a quantity such as charge, current, or voltage. It is understood the disclosed methods of coefficient determination are not limited to quantities that may be readout by the circuit 100. In some embodiments, depending on a particular application, $\mu$ is temperature, pressure, or X-ray dosage; the degree of freedom built in coefficients $C_1$ and $C_2$ may help linearize other aspects of the system, beyond the disclosed circuits.

In some embodiments, the coefficients associated with the FIR decimator 122 (e.g., coefficients for FIR filters) are determined using at least one of an analytical determination, a simulation-based numerical determination, and a measurement-based numerical determination.

For example, $C_1$ and $C_2$ are linear optimal FIR coefficients determined using at least one of an analytical determination, a simulation-based numerical determination, and a measurement-based numerical determination. In some embodiments, the number of coefficients of $C_1$ is the number of cycles of the CTIA (e.g., cycles of quantizer decision times and feedback times), and the number of coefficients of $C_2$ is the number of oversampling (OSR) cycles of the SD modulator. Using analytical determination (e.g., theoretical analysis), a constant for $C_1$ and an accumulate filter for $C_2$ may be used. These filter coefficients may be used as default values. More optimal filter coefficients may use simulation-based numerical determination and measurement-based numerical determination for more specific circuit implementations.

Using simulation-based numerical determination (e.g., numerical simulation), the coefficients would more closely reflect the structure of the circuit. Using measurement-based numerical determination (e.g., experimental-based), optimal coefficients could be found for a specific chip incorporating noise and systemic errors (e.g., op-amp non-idealities, device mismatches). In some embodiments, these coefficients are determined prior to operating the circuit 100 (e.g., prior to operating a system that includes the circuit 100, during manufacturing of the circuit 100). In some embodiments, these coefficients are determined or updated while operating the circuit 100 (e.g., calibration is performed and more suitable coefficients may be determined). In some embodiments, the circuit 100 is calibrated in wafer form, using probe cards, as packaged chips, or embedded in a sensing system to yield an optimum decimation filter. In some embodiments, the variables of equation (5) (e.g., a weight of a coefficient) are calibrated by operating the circuit 100 without an input signal (e.g., integrating with the CTIA without an input signal).

In some embodiments, in simulation-based numerical determination and measurement-based numerical determination, input analog values ($\mu_1, \mu_2, \ldots, \mu_N$) are used to generate outputs $(A1_1, A1_2, \ldots, A1_N), (A2_1, A2_2, \ldots, A2_N)$. The number N is equal to or larger than the parameters to be determined, which is equal to the number of components of $C_1$+number of components of $C_2$+3 (e.g., for $g_1$, $g_2$, $\mu_0$). Numerical methods, such as least square fitting, are used to determine $C_1$, $C_2$, $g_1$, $g_2$, $\mu_0$ and a linear transformation from output to input:

$$\begin{pmatrix} \mu_1 \\ \mu_2 \\ \ldots \\ \mu_N \end{pmatrix} = g_1 \left( \begin{pmatrix} A1_1 \\ A1_2 \\ \ldots \\ A1_N \end{pmatrix} C_1 + g_2 \begin{pmatrix} A2_1 \\ A2_2 \\ \ldots \\ A2_N \end{pmatrix} C_1 \right) + \mu_0 \quad (6)$$

In some embodiments, depending on the parameters of the chip production (e.g., less parameters), simulation-based numerical determination is advantageously a less complex method of determining coefficients. In some embodiments, simulation-based numerical determination sets default coefficients for a system, and measurement-based numerical determination is used for more accurate values.

In some embodiments, depending on the parameters of the chip production (e.g., more parameters), measurement-based numerical determination is performed during wafer probed characterization of an ASIC with on-chip test circuits, such as stable reference voltage levels. Using measurement-based numerical determination may more accurately determine the coefficients when chip production parameters are more complex.

In some embodiments, the FIR coefficients of $C_1$ and $C_2$ are treated as independent variables, and in some examples, the number of independent variables are reduced. For example, for charge measurement, $C_1$ is a constant, and $C_2$ is non-zero during a time when the ADC 118 is running (e.g., when a residue value is being converted). In some examples, further constraints, such as continuity, are applied to further reduce the number of independent variables and reduce the complexity of determining optimal FIR coefficients.

In some embodiments, the circuit 100 includes a timing and control circuit 124 that provides timing and control signals for operating elements of the circuit 100. For example, the timing and control circuit 124 is electrically coupled to the quantizer 104, the ADC 118, the offset removal circuit 120, and FIR decimator 122 to control their respective timing. As another example, the timing and control circuit 124 generates timing and control signals for generating the waveforms and timing diagrams described with respect to FIGS. 2 and 3. The timing and control circuit 124 may provide timing and control signals for other elements of the circuit 100 (e.g., CTIA 102, DAC 106, summer 108).

Although the circuit 100 is described with the illustrated elements, it is understood that the illustration is merely exemplary. Different elements or additional elements may be added or removed from the circuit 100 to form the disclosed data converter. The described elements may also be electrically coupled or configured differently than illustrated. For example, the offset removal circuit 120 may be electrically coupled differently than illustrated in FIG. 1. The offset removal circuit may be included as part of the CTIA, as described with respect to FIGS. 5 and 6. As another example, although the circuit 100 is illustrated as converting a single-ended signal, it is understood that the circuit 100 may also convert differential signals (e.g., the elements of the circuit 100 are configured for differential signaling). As yet another example, the circuit 100 may not include a digital filter or a FIR decimator 122; the output of the quantizer 104 and/or the ADC 118 may provide the digital output signal 112, and the digital output signal 112 is outputted to subsequent components for further processing.

As another example, although the circuit 100 is illustrated to include a first order CTIA at a first stage and an ADC (e.g., a second order Sigma-Delta converter) as the second stage, other choices of CTIA or ADC order and quantizer choices (e.g., single bit vs. multi-bit) may be included in the circuit 100. These choices may be determined by system requirements (e.g., accuracy, area, sensor type, sensor array size). For example, the circuit 100 described with respect to FIG. 1 may be a simpler architecture that may be advantageous for larger sensor arrays, where area efficiency may be an important constraint.

Figure 2:
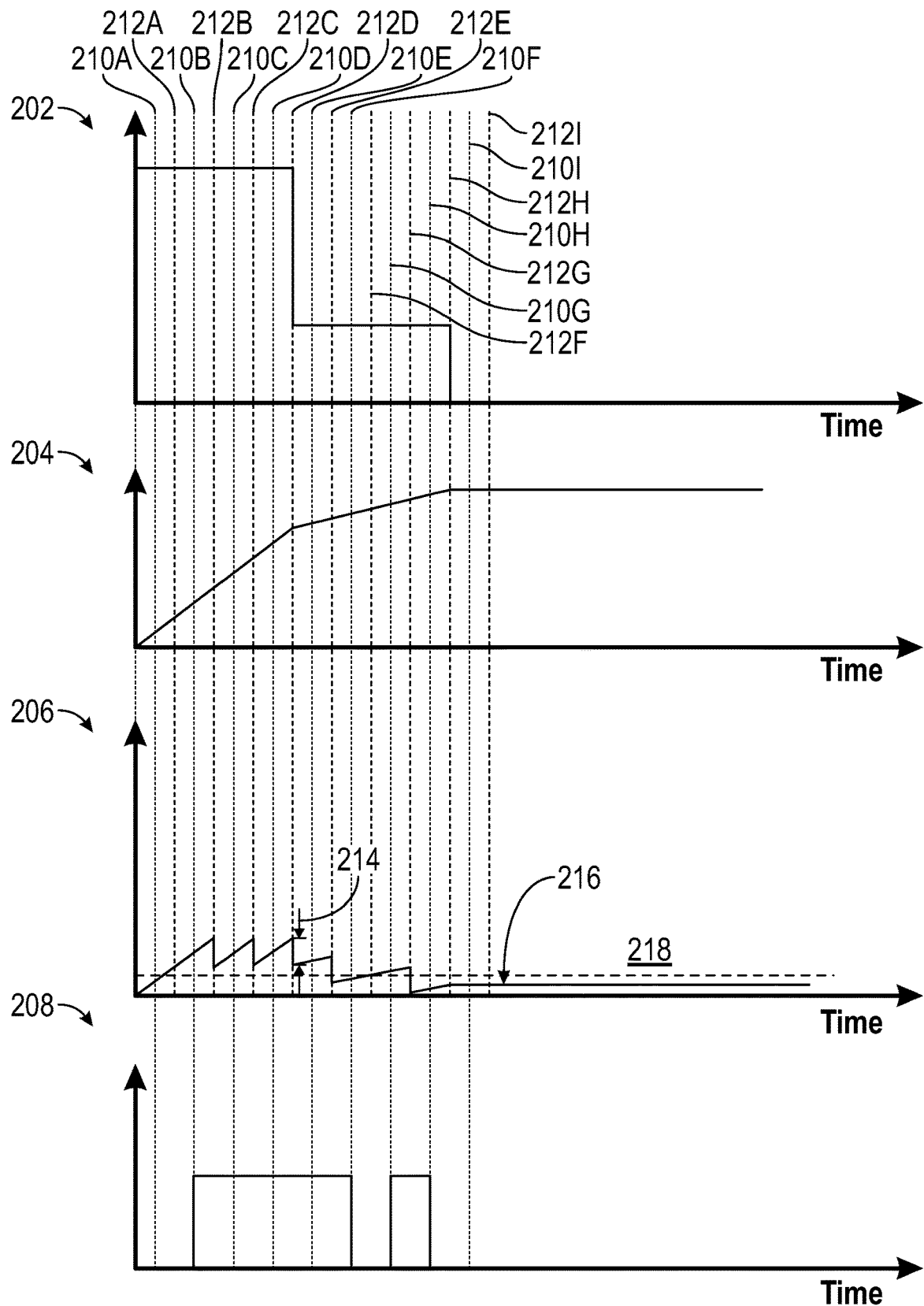
FIG. 2 illustrates exemplary waveforms of a circuit, according to embodiments of this disclosure.

FIG. 2 illustrates exemplary waveforms of a circuit, according to embodiments of this disclosure. In some embodiments, FIG. 2 illustrates exemplary waveforms of the circuit 100, circuit 400, circuit 500, or circuit 600. In some embodiments, the waveforms include input waveform 202, conventional CTIA output waveform 204, CTIA output waveform 206, and quantizer output waveform 208. In some embodiments, the input waveform 202 is a waveform of an input signal (e.g., an input current, input signal 110, input signal 410), the CTIA output waveform 206 is a waveform of a CTIA (e.g., an output voltage of CTIA 102, an output voltage of CTIA 402, an output voltage of circuit 500, an output voltage of circuit 600), and the quantizer output waveform 208 is a waveform of the output of a quantizer (e.g., a voltage output of quantizer 104, a voltage output of quantizer 404). The conventional CTIA output waveform 204 is a waveform (e.g., a voltage output) of the output of a CTIA without the described integration that is used to integrate the signal corresponding to input waveform 202, and is included for illustrative purposes to show the advantages of the CTIA.

In some embodiments, the operation of the circuit 100 is divided into quantizer decision times 210 (indicated with lighter vertical dashed lines) and feedback times 212 (indicated with darker vertical dashed lines). In some embodiments, the timing and control circuit (e.g., timing and control circuit 124, timing and control circuit 424) provides control signals for these times in the circuit. For example, the timing and control circuit generates a 50% duty cycle square wave clock signal with its rising edge aligned with the quantizer decision times 210 to control quantizer decision, and generates a compliment of this clock with its rising edge aligned with the feedback times 212 to control feedback of reducing the value. It is understood that the clock signal may have different duty cycles and have different shapes.

As illustrated, before the first quantizer decision time 210A, the input (e.g., corresponding to input waveform 202, input of CTIA, input signal 110, input signal 410) charges the feedback capacitor (e.g., feedback capacitor 116, feedback capacitor 416, feedback capacitor 516, feedback capacitor 616) and causes the output of the CTIA to rise. At the first quantizer decision time 210A, the value of the CTIA output waveform 206 is compared to the threshold 218 (e.g., threshold of quantizer 104 or quantizer 404). In some embodiments, the quantizer compares the value of the CTIA output waveform 206 with the threshold 218. As illustrated, at the first quantizer decision time 210A, in accordance with a determination that the CTIA output waveform 206 is not greater than the threshold 218, the quantizer output waveform 208 is a "low" value (e.g., zero, ground, a low logic voltage level).

Between the first quantizer decision time 210A and the first feedback time 212A, the input continues to charge the feedback capacitor and causes the output of the CTIA to continue to rise. At the first feedback time 212A, as illustrated, the DAC (e.g., DAC 106, DAC 406) received the decision of the quantizer, and in accordance with the quantizer decision that the CTIA output waveform 206 is not greater than the threshold 218, the DAC does not output a high DAC output signal to the summer (e.g., summer 108, summer 408) (e.g., the circuit forgoes reducing the high DAC output signal from the output of the CTIA).

Between the first feedback time 212A and the second quantizer decision time 210B, the input continues to charge the feedback capacitor and causes the output of the CTIA to continue to rise. At the second quantizer decision time 210B, the value of the CTIA output waveform 206 is compared to the threshold 218 (e.g., threshold of quantizer 104 or quantizer 404). As illustrated, at the second quantizer decision time 210B, in accordance with a determination that the CTIA output waveform 206 is greater than the threshold 218, the quantizer output waveform 208 is a "high" value (e.g., one, high supply value, a high logic voltage level).

Between the second quantizer decision time 210B and the second feedback time 212B, the input continues to charge the feedback capacitor and causes the output of the CTIA to continue to rise. At the second feedback time 212B, as illustrated, the DAC receives the decision of the quantizer, and in accordance with the quantizer decision that the CTIA output waveform 206 is greater than the threshold 218, the DAC outputs a high DAC output signal to the summer. A value (e.g., fixed value 214) is reduced from the output of the CTIA. This causes the value of the CTIA output waveform 206 to reduce by fixed value 214 at the second feedback time 212B. Although the CTIA output signal is described to be reduced by a fixed value, it is understood that in some embodiments, during integration, the CTIA output signal may be reduced by different values at different times of the integration.

Between the second feedback time 212B and the third quantizer decision time 210C, after the value of the CTIA output waveform 206 to reduce by fixed value 214, the input continues to charge the feedback capacitor and causes the output of the CTIA to continue to rise. At the third quantizer decision time 210C, the value of the CTIA output waveform 206 is compared to the threshold 218 (e.g., threshold of quantizer 104 or quantizer 404). As illustrated, at the third quantizer decision time 210C, in accordance with a determination that the CTIA output waveform 206 is greater than the threshold 218, the quantizer output waveform 208 is a "high" value (e.g., one, high supply value, a high logic voltage level).

Between the third quantizer decision time 210C and the third feedback time 212C, the input continues to charge the feedback capacitor and causes the output of the CTIA to continue to rise. At the third feedback time 212C, as illustrated, the DAC receives the decision of the quantizer, and in accordance with the quantizer decision that the CTIA output waveform 206 is greater than the threshold 218, the DAC 106 outputs a high DAC output signal to the summer. The value (e.g., fixed value 214) is reduced from the output of the CTIA. This causes the value of the CTIA output waveform 206 to reduce by value 214 at the third feedback time 212C.

As illustrated, because value of the input waveform 202 is the same between the second feedback time 212B and the fourth feedback time 212D, the value of the CTIA output waveform 206 between the third and fourth feedback times 212D varies similarly to how the CTIA output waveform 206 varies between the second and third feedback times 212C.

As illustrated, at the fourth feedback time 212D, the value of the input waveform 202 is reduced from its initial value. Accordingly, between the fourth feedback time 212D and the fifth quantizer decision time 210E, after the value of the CTIA output waveform 206 to reduce by fixed value 214, the input continues to charge the feedback capacitor and causes the output of the CTIA to continue to rise, but at a slower rate compared to the previous rate (e.g., because initial value of the input is a higher value than this current value of the input). At the fifth quantizer decision time 210E, the value of the CTIA output waveform 206 is compared to the threshold 218 (e.g., threshold of quantizer 104 or quantizer 404). As illustrated, at the fifth quantizer decision time 210E, in accordance with a determination that the CTIA output waveform 206 is greater than the threshold 218, the quantizer output waveform 208 is a "high" value (e.g., one, high supply value, a high logic voltage level).

Between the fifth quantizer decision time 210E and the fifth feedback time 212E, the input continues to charge the feedback capacitor and causes the output of the CTIA to continue to rise (at this slower rate). At the fifth feedback time 212E, as illustrated, the DAC receives the decision of the quantizer, and in accordance with the quantizer decision that the CTIA output waveform 206 is greater than the threshold 218, the DAC outputs a high DAC output signal to the summer. The value (e.g., fixed value 214) is reduced from the output of the CTIA. This causes the value of the CTIA output waveform 206 to reduce by fixed value 214 at the fifth feedback time 212E.

Between the fifth feedback time 212E and the sixth quantizer decision time 210F, after the value of the CTIA output waveform 206 to reduce by fixed value 214, the input continues to charge the feedback capacitor and causes the output of the CTIA to continue to rise. At the sixth quantizer decision time 210F, the value of the CTIA output waveform 206 is compared to the threshold 218 (e.g., threshold of quantizer 104 or quantizer 404). As illustrated, at the fifth quantizer decision time 210E, in accordance with a determination that the CTIA output waveform 206 is not greater than the threshold 218, the quantizer output waveform 208 is a "low" value (e.g., zero, ground, a low logic voltage level).

Between the sixth quantizer decision time 210F and the sixth feedback time 212F, the input continues to charge the feedback capacitor and causes the output of the CTIA to continue to rise. At the sixth feedback time 212F, as illustrated, the DAC receives the decision of the quantizer, and in accordance with the quantizer decision that the CTIA output waveform 206 is not greater than the threshold 218, the DAC does not output a high DAC output signal to the summer (e.g., the circuit forgoes reducing the high DAC output signal from the output of the CTIA).

Between the sixth feedback time 212F and the seventh quantizer decision time 210G, the input continues to charge the feedback capacitor and causes the output of the CTIA to continue to rise. At the seventh quantizer decision time 210G, the value of the CTIA output waveform 206 is compared to the threshold 218 (e.g., threshold of quantizer 104). As illustrated, at the seventh quantizer decision time 210G, in accordance with a determination that the CTIA output waveform 206 is greater than the threshold 218, the quantizer output waveform 208 is a "high" value (e.g., one, high supply value, a high logic voltage level).

Between the seventh quantizer decision time 210G and the seventh feedback time 212G, the input continues to charge the feedback capacitor and causes the output of the CTIA to continue to rise. At the seventh feedback time 212G, as illustrated, the DAC receives the decision of the quantizer, and in accordance with the quantizer decision that the CTIA output waveform 206 is greater than the threshold 218, the DAC outputs a high DAC output signal to the summer. The value (e.g., fixed value 214) is reduced from the output of the CTIA. This causes the value of the CTIA output waveform 206 to reduce by fixed value 214 at the seventh feedback time 212G.

Between the seventh feedback time 212G and the eighth quantizer decision time 210H, after the value of the CTIA output waveform 206 to reduce by fixed value 214, the input continues to charge the feedback capacitor and causes the output of the CTIA to continue to rise. At the eighth quantizer decision time 210H, the value of the CTIA output waveform 206 is compared to the threshold 218 (e.g., threshold of quantizer 104). As illustrated, at the eighth quantizer decision time 210H, in accordance with a determination that the CTIA output waveform 206 is not greater than the threshold 218, the quantizer output waveform 208 is a "low" value (e.g., zero, ground, a low logic voltage level).

Between the eighth quantizer decision time 210H and the eighth feedback time 212H, the input continues to charge the feedback capacitor and causes the output of the CTIA to continue to rise. At the eighth feedback time 212H, as illustrated, the DAC receives the decision of the quantizer, and in accordance with the quantizer decision that the CTIA output waveform 206 is not greater than the threshold 218, the DAC does not output a high DAC output signal to the summer (e.g., the circuit forgoes reducing the high DAC output signal from the output of the CTIA).

As illustrated, at the eighth feedback time 212H, the value of the input waveform 202 is reduced to zero (e.g., an electrically coupled sensor finishes discharging, readout for an electrically coupled sensor is completed). Accordingly, after the eighth feedback time 212H, the feedback capacitor ceases charging and causes the output of the CTIA to become a constant value. In some embodiments, this constant output of the CTIA 102 after the eighth feedback time 212H is the residue (e.g., residue 216, the residue voltage, the voltage corresponding to the residue charge). In some embodiments, an ADC (e.g., ADC 118, ADC 418) receives the residue, converts the residue into a digital value, and provides the digital value of the residue to a FIR decimator (e.g., FIR decimator 122, FIR decimator 422).

By integrating portions of the input signal at different times and reducing the CTIA output by a value (e.g., fixed value 214) after integrating a portion, the CTIA is allowed to advantageously integrate adaptively. As an exemplary advantage, as illustrated by the difference between conventional CTIA output waveform 204 and CTIA output waveform 206 (e.g., the feedback capacitor of the conventional CTIA continues to charge until the input is zero), the disclosed circuit and methods of operating the circuits may allow the feedback capacitance value to be smaller, compare to a feedback capacitor of a CTIA that conventionally integrates. The CTIA with a smaller feedback capacitor may be able to integrate a same input as the conventional CTIA with the bigger feedback capacitor. Accordingly, a corresponding output voltage may be higher (e.g., due to the Q=CV relationship), relaxing the resolution or sensitivity requirements of subsequent circuitry (e.g., an ADC). As another exemplary advantage, because the CTIA is allowed to integrate adaptively, the disclosed circuits and methods of operating the circuits may accommodate readout of different array sizes, different kind of pixels, and/or different dynamic ranges, reducing a need for different CTIA and reducing cost for designing specific readout circuits.

Furthermore, because the CTIA is allowed to integrate adaptively, the CTIA may be configured for variable gain by varying integration time (e.g., by varying the timing between quantizer decision times 210 and feedback times 212), reducing a need for additional feedback capacitors for different gains. Additionally, by integrating as described, portions of the input may be converted at a same time (e.g., a first portion of the input is converted after being integrated while a second portion of the input is being integrated), reducing a need for sample and hold circuits and additional capacitors without reducing conversion speed.

The area efficiency and flexibility of the disclosed circuits (e.g., enabled by operating the circuits using the disclosed methods) may be advantageously suited for arrayed sensors such as X-ray, visible and infrared imaging, and MEMS sensors, where sets of signals may be readout and converted to digital form. Without changing the hardware, the disclosed circuits advantageously can be configured to convert data for different array sizes, different kind of sensors, or different dynamic ranges (e.g., by adjusting the timing between quantizer decision times 210 and feedback times 212) while maintaining an accuracy of a corresponding data conversion circuit that conventionally integrates.

Although the waveforms of FIG. 2 are illustrated as having specific relationships with time, it is understood that the illustrated waveforms are exemplary. The waveforms may have relationships with time that are different than those that are illustrated. For example, the input waveform 202 may have a different relationship with time than illustrated (e.g., a decaying exponential, a constant value (e.g., by using the disclosed variable resistor at the input of the circuit), a relationship depending on electrical characteristics of the sensor pixel (e.g., sensor pixel capacitance, sensor pixel impedance) and/or sensor array (e.g., sensor column capacitance, sensor column impedance), a relationship depending on readout method). Based on the input waveform 202 and the described integration, CTIA output waveform 206 and quantizer output waveform 208 are generated accordingly. As another example, based on system requirements (e.g., sensitivity, resolution, power consumption) and application (e.g., sensor array size, types of sensor), the timing of the integration (e.g., timing of quantizer decision times 210, timing of feedback times 212) may be different than illustrated.

Figure 3:
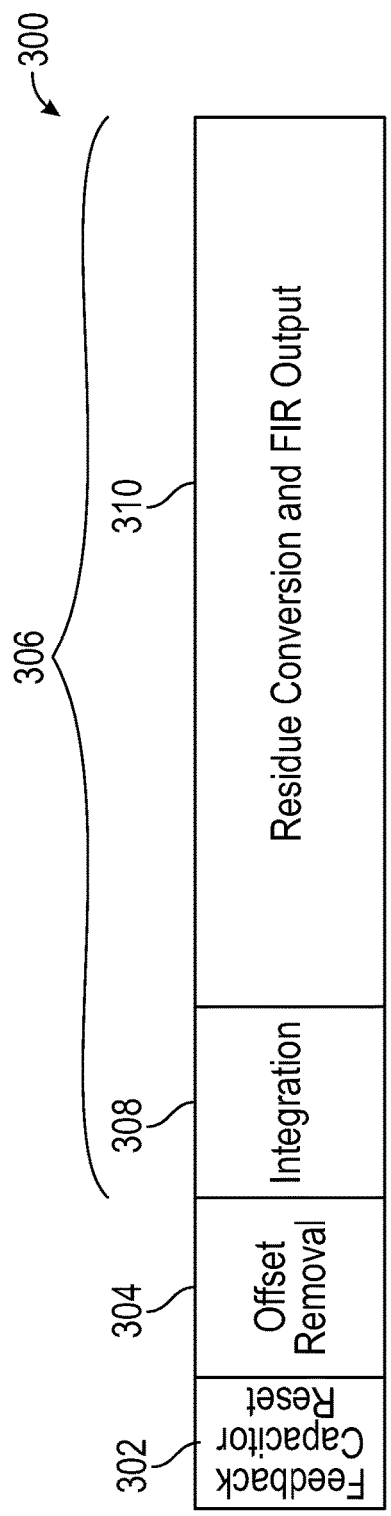
FIG. 3 illustrates an exemplary timing diagram, according to embodiments of this disclosure.

FIG. 3 illustrates an exemplary timing diagram 300, according to embodiments of this disclosure. In some embodiments, the timing diagram 300 is an illustrative representation of an operation of the circuit 100, circuit 400, circuit 500, or circuit 600. In some embodiments, the timing diagram 300 includes five portions—feedback capacitor reset 302, offset removal 304, sensor readout 306, integration 308, and residue conversion and FIR output 310.

For example, for a sensor array having 512 rows with a 30 Hz frame refresh rate, a corresponding row time is 65 µs. In this example, the feedback capacitor reset 302 time is 2 µs, the offset removal 304 time is 10 µs, the integration 308 time is 12 µs, and the residue conversion and FIR output 310 time is 40 µs. For example, for a 3.2 MHz clock, the 10 µs of offset removal time means that 32 samples are captured during offset removal 304, and the 40 µs of residue conversion and FIR output time means that 128 samples are captured by the ADC (e.g., ADC 118, ADC 418).

In some embodiments, during feedback capacitor reset 302, before a sensor pixel begins transferring charge to the CTIA, the feedback capacitor of the CTIA (e.g., feedback capacitor 116, feedback capacitor 416, feedback capacitor 516, feedback capacitor 616) is reset by a reset switch (e.g., reset switch 126, reset switch 426, reset switch 514, reset switch 620) by closing during feedback capacitor reset 302 time to clear remaining charge on the feedback capacitor (e.g., reset the value of the output of the CTIA (e.g., leaving an offset value at the output)).

In some embodiments, during offset removal 304, an offset of the CTIA is removed. For example, during offset removal 304, the offset removal circuit (e.g., offset removal circuit 120, circuit 400) captures the offset value, and the offset value is subtracted from the residue charge or the residue voltage prior to being provided to an ADC (e.g., ADC 118, ADC 418), removing the offset from the digital output signal (e.g., digital output signal 112, digital output signal 412) and improving the data conversion accuracy of the circuit.

In some embodiments, during offset removal 304, correlated offset removal is performed. For example, the offset removal circuit is configured for correlated double sampling. After the reset switch resets the feedback capacitor (e.g., after feedback capacitor reset 302), random noise may be measured. To remove this random noise, the output of the CTIA is measured (e.g., measured multiple times and averaged) by the offset removal circuit—once at the start or before the start of integration, measuring the noise charge, and once at the end or after integration completes, measuring an integrated signal or a residue plus the noise charge. The difference of these two measured values (e.g., the difference of these two measured values would exclude the offset) is converted to a digital value using ADC 118 (e.g., a Sigma-Delta converter).

In some embodiments, during offset removal 304, an ADC of the circuit (e.g., ADC 118, ADC 418) is configured to convert an offset of the CTIA (e.g., an average value of the offset over a plurality of samples) into a digital value. A value corresponding to the converted offset is removed from an output signal to better remove an offset component from the digital output signal. For example, prior to the start of integration, the ADC 418 converts the offset of the CTIA 402 into a digital value or digital values, and the digital value(s) of the offset is used for offset removal from the digital output signal 412, as described in more detail with respect to FIG. 4.

In some embodiments, the offset removal 304 time is set to allow a low-pass filter (e.g., as described with respect to FIGS. 5 and 6) to sufficiently remove high frequency noise from the offset signal. In some embodiments, the offset removal 304 time is set to be several times (e.g., 2-10 times) larger than a time constant of a low-pass filter (e.g., as described with respect to FIGS. 5 and 6).

In some embodiments, during sensor readout 306, a sensor pixel is selectively electrically coupled to the circuit for readout (e.g., a row of sensor pixels is selectively electrically coupled to a corresponding number of circuits for readout). In some embodiments, during this time, the sensor pixel charge is being transferred to the CTIA for integration (e.g., integration 308). In some embodiments, a transition for a sensor pixel or a row of sensor pixels to be selectively coupled to a corresponding circuit is 0.1 µs. In some embodiments, as illustrated, sensor readout 306 occurs between integration 308 and residue conversion and FIR output 310. In some embodiments, sensor readout 306 occurs during parts of integration 308 and residue conversion and FIR output 310. At the end of sensor readout 306, the sensor pixel is electrically decoupled from the circuit. Exemplary methods of sensor readout can be found in International Application No. PCT/US2019/027982 and PCT/US2019/046066, the entireties of which are incorporated herein by reference in their entireties for all purposes.

In some embodiments, during integration 308, integration, as described with respect to FIGS. 1 and 2, is performed. Descriptions and advantages associated with the described integration are not repeated here.

Figure 4:
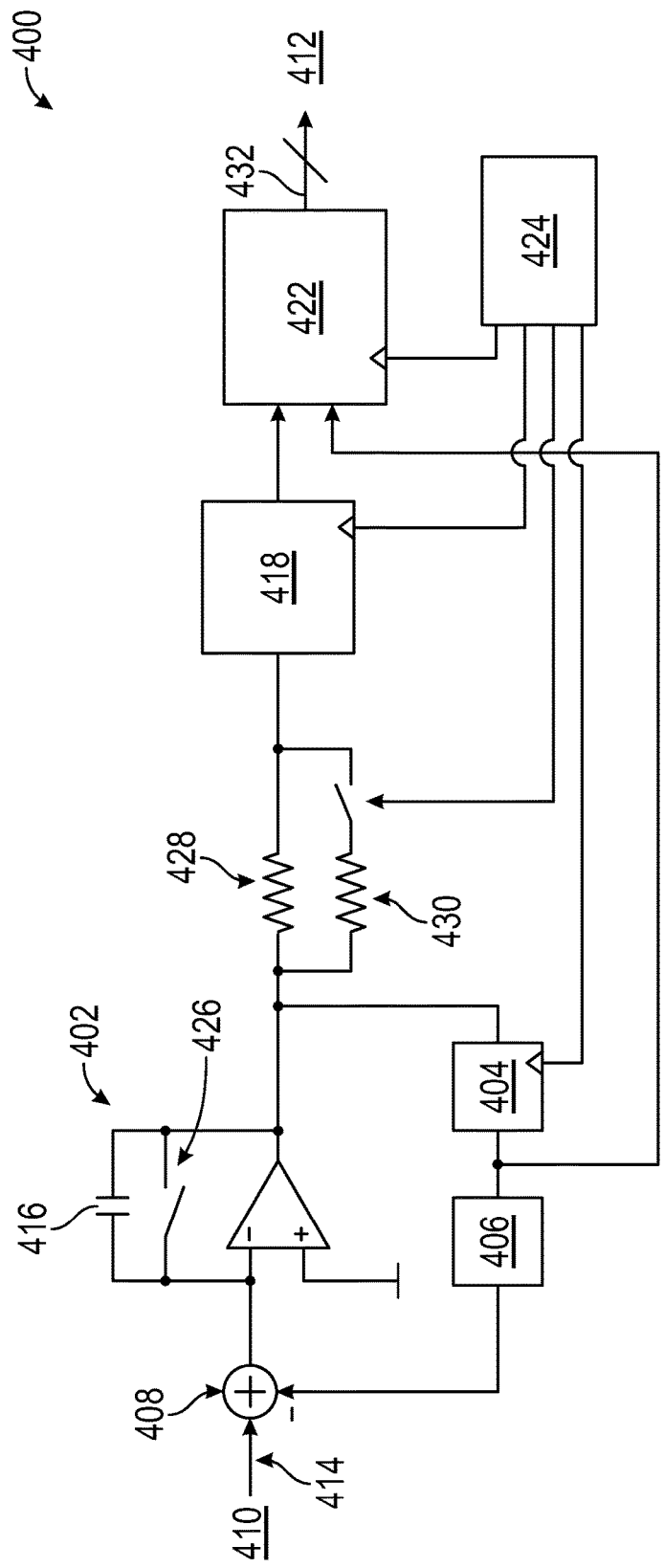
FIG. 4 illustrates an exemplary circuit, according to embodiments of this disclosure.

In some embodiments, during residue conversion and FIR output 310, the residue of the CTIA, as described with respect to FIGS. 1, 2, and 4, is being converted into a digital value by an ADC (e.g., ADC 118, ADC 418). The digital value of the residue and the output of the quantizer (e.g., quantizer 104, quantizer 404) (e.g., a sequence of pulses generated from the integration, quantizer output waveform 208) are received by a FIR decimator (e.g., FIR decimator 122, FIR decimator 422). The FIR decimator, using coefficients determined using the methods described herein, processes the output of the quantizer or the output of the quantizer and the digital value of the residue to generate digital output signal (e.g., digital output signal 112, digital output signal 412, which is a digital representation of the input signal (e.g., input signal 110, input signal 410)).

Although the timing diagram 300 is illustrated as including four portions, and the four portions as having a particular order, it is understood that the timing diagram 300 may include different portions, different ordering of portions, and/or portions having different timing. For example, portions of timing diagram 300 may overlap (e.g., integration 308 and steps of residue conversion and FIR output 310 may be occurring concurrently). As another example, integration continues after the quantizer is stopped from switching (e.g., for MASH, the CTIA is electrically coupled to the ADC and continues to integrate while the quantizer is turned off).

FIG. 4 illustrates an exemplary circuit 400, according to embodiments of this disclosure. In some embodiments, the circuit 400 is a data converter (e.g., Sigma-Delta converter). In some embodiments, the circuit 400 includes elements described with respect to circuit 100 in FIG. 1. For example, CTIA 402 corresponds to CTIA 102, quantizer 404 corresponds to quantizer 104, DAC 406 corresponds to DAC 106, summer 408 corresponds to summer 108, signal 410 at input 414 corresponds to signal 110 at input 114, feedback capacitor 416 corresponds to feedback capacitor 116, reset switch 426 corresponds to reset switch 126, ADC 418 corresponds to ADC 118 (e.g., a Sigma-Delta converter), FIR decimator 422 corresponds to FIR decimator 122 included in a digital filter, timing and control circuit 424 corresponds to timing and control circuit 124, digital output signal 412 corresponds to digital output signal 112, and digital output 432 corresponds to digital output 128. Some descriptions and advantages associated with these elements are not repeated here.

In some embodiments, the ADC 418 is configured to convert a residue of the CTIA 402 and an offset of the CTIA 402. For example, prior to the start of integration, the ADC 418 converts the offset of the CTIA 402 into a digital value or digital values (e.g., an average value of the offset over a plurality of samples), and the digital value of the offset is used for offset removal from the digital output signal 412. A value corresponding to the converted offset is removed from the digital output signal 412 to better remove an offset component from the digital output signal 412 and improve the accuracy of the digital output signal 412 (e.g., when compared to the input 410).

In some embodiments, the offset of the CTIA 402 is smaller than the residue of the CTIA 402 (e.g., around 20 times smaller). In some embodiments, the circuit 400 includes resistors 428 and 430. In some embodiments, the offset is scaled (e.g., amplified) by the configuration of the resistors 428 and 430. For example, the resistor 428 has a resistance 19 times greater than the resistance of resistor 430. When the ADC 418 is used to convert the offset signal, the resistors 428 and 430 are electrically coupled in parallel (e.g., controlled by timing and control circuit 424), amplifying a current generated by the offset signal by a factor of 20, compared to only resistor 428 being electrically coupled. When the ADC 418 is used to convert the residue signal, the resistor 428 is electrically coupled. As an exemplary advantage, by amplifying the smaller offset signal, the ADC 418 may be used to convert both the offset signal and the residue signal, and a second and higher-resolution ADC may not be needed to convert the smaller offset signal (e.g., an ADC with 10-bit resolution may be needed instead of an ADC with 14-bit resolution that may be needed without using resistor 430).

In some embodiments, in lieu of resistors 428 and 430, to reduce the required resolution of the ADC 418, the capacitance of the feedback capacitor 416 or the value by which the CTIA output is being reduced is decreased to increase the sensitivity at the ADC 418 input during offset removal (e.g., offset removal 304).

Figure 5:
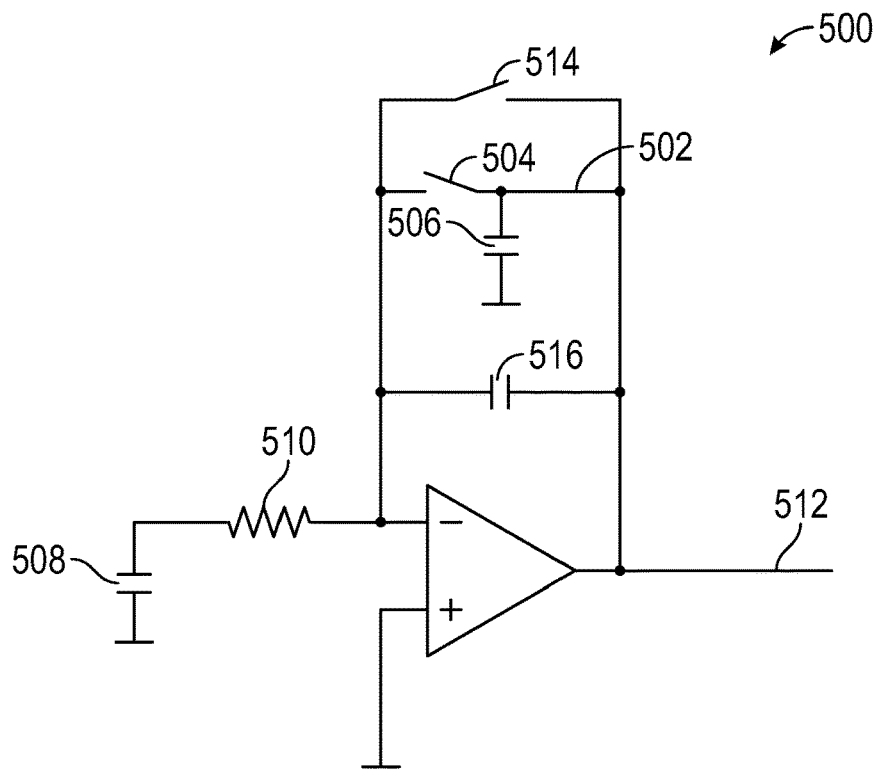
FIG. 5 illustrates an exemplary circuit, according to embodiments of this disclosure.

FIG. 5 illustrates an exemplary circuit 500, according to embodiments of this disclosure. In some embodiments, the circuit 500 includes elements described with respect to circuit 100 in FIG. 1 and circuit 400 in FIG. 4. For example, the circuit 500 is CTIA 102 or CTIA 402, reset switch 514 is reset switch 126 or reset switch 426, and feedback capacitor 516 is feedback capacitor 116 or feedback capacitor 416. The capacitor 508 and resistor 510 represent a loading at the input of the circuit 500 (e.g., equivalent capacitance and resistance of a sensor and/or a corresponding column electrically coupled to the input of the circuit, the equivalent capacitance and resistance of input 114 or input 414). Some descriptions and advantages associated with these elements are not repeated here.

In some embodiments, the circuit 500 is a CTIA that includes a feedback capacitor 516 and an offset removal circuit. In some embodiments, the offset removal circuit is included in a feedback of the CTIA and includes first switch 502 (illustrated as being closed/conducting), second switch 504, and offset sampling capacitor 506. In some embodiments, the capacitance of the offset sampling capacitor 506 is the capacitance of the feedback capacitor 516.

As an example, after the feedback capacitor 516 is reset (e.g., after feedback capacitor reset 302), the first switch 502 is closed or conducting, causing the offset sampling capacitor 506 and the feedback capacitor 516 to sample an offset voltage of the circuit 500 (e.g., offset voltage of the CTIA). Because the capacitances of the offset sampling capacitor 506 and the feedback capacitor 516 are equal, both capacitor sampled the offset voltage. After sampling the offset voltage, the first switch 502 opens or stops conducting, and the second switch 504 closes or conducts, causing the charge stored in the offset sampling capacitor 506 to be transferred to an input of the amplifier. The transferred charge cancels the offset voltage stored on the feedback capacitor 516, removing the offset at the output of the circuit 500.

In some embodiments, a time needed to transfer the charge stored in the offset sampling capacitor 506 to an input of the amplifier is limited by a gain-bandwidth product of the amplifier. In some embodiments, after the offset is removed at the output of the circuit 500, the second switch 504 is reopened. In some embodiments, the second switch 504 remains closed.

As an exemplary advantage, because the disclosed CTIA may require one feedback capacitor for different applications, compared to a conventional CTIA that may require more than one feedback capacitor for the different applications, an offset removal circuit for the CTIA may be simplified. By simply adding the first and second switches 502 and 504 and an offset capacitor 516 in the feedback of the CTIA, the offset of the CTIA may be removed. Circuit area may be reduced, compared to a conventional CTIA, because additional offset removal circuitry may not be needed and the offset removal may be included in the feedback of the CTIA.

Figure 6:
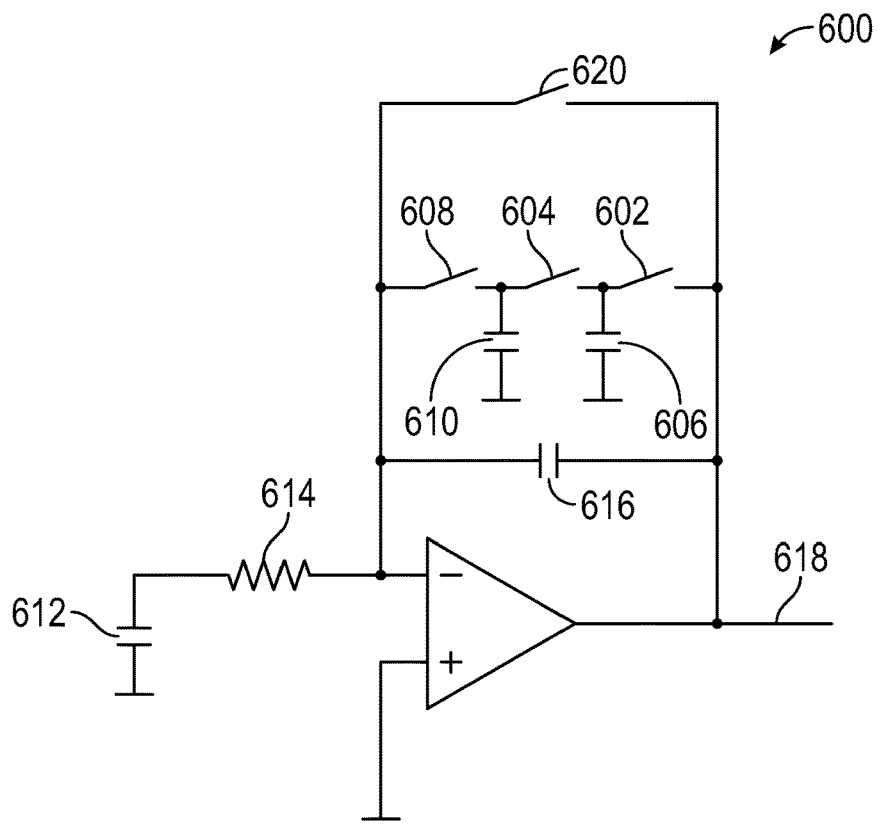
FIG. 6 illustrates an exemplary circuit, according to embodiments of this disclosure.

FIG. 6 illustrates an exemplary circuit 600, according to embodiments of this disclosure. In some embodiments, the circuit 600 includes elements described with respect to circuit 100 in FIG. 1, circuit 400 in FIG. 4, or circuit 500 in FIG. 5. For example, the circuit 600 is CTIA 102 or CTIA 402, reset switch 620 is reset switch 126, reset switch 426, or reset switch 514, and feedback capacitor 616 is feedback capacitor 116, feedback capacitor 416, or feedback capacitor 516. The capacitor 612 and resistor 614 represent a loading at the input of the circuit 600 (e.g., equivalent capacitance and resistance of a sensor and/or a corresponding column electrically coupled to the input of the circuit, the equivalent capacitance and resistance of input 114 or input 414). Some descriptions and advantages associated with these elements are not repeated here.

In some embodiments, the circuit 600 is a CTIA that includes a feedback capacitor 616, an offset removal circuit, and a low-pass filter. In some embodiments, the low-pass filter is included in a feedback of the circuit 600. In some embodiments, the low-pass filter and the offset removal circuit are included in the feedback of the circuit 600.

In some embodiments, the first switch 602, second switch 604, capacitor 606, third switch 608 and offset sampling capacitor 610 function as a low-pass filter and an offset removal circuit. In some embodiments, the capacitance of the capacitor 606 is smaller than the capacitance of the offset sampling capacitor 610. In some embodiments, the first switch 602, second switch 604, and capacitor 606 functions as a switch capacitor.

As an example, after the feedback capacitor 616 is reset (e.g., after feedback capacitor reset 302), the first switch 602 and the second switch 604 alternate between closing or conducting and opening or non-conducting (e.g., the first and second switches are controlled by complimentary clock signals), causing the capacitor 606 to sample some of offset charge and transfer this sampled offset charge to the offset sampling capacitor 610. At a same time, the feedback capacitor 616 samples the offset voltage, similar to how feedback capacitor 516 samples the offset voltage, as described with respect to FIG. 5.

In some embodiments, f is a frequency of the clocks controlling the first and second switches 602 and 604. The effective time constant of the low-pass filter is:

$$\tau = \frac{C_{610}}{(f \times C_{606})} \tag{7}$$

The first and second switches 602 and 604 switch in an alternating manner, transferring portions of the offset charge from the capacitor 606 to the offset sampling capacitor 610.

Because the capacitances of the offset sampling capacitor 610 and the feedback capacitor 616 are equal, both capacitor sampled the offset voltage. After sampling the offset voltage, the third switch 608 closes or conducts, causing the charge stored in the offset sampling capacitor 610 to be transferred to an input of the amplifier. The transferred charge cancels the offset voltage stored on the feedback capacitor 616, removing the offset at the output of the circuit 600.

In some embodiments, a time needed to transfer the charge stored in the offset sampling capacitor 610 to an input of the amplifier is limited by a gain-bandwidth product of the amplifier. In some embodiments, after the offset is removed at the output of the circuit 600, the third switch 608 is reopened. In some embodiments, the third switch 608 remains closed.

As an exemplary advantage, because the disclosed CTIA may require one feedback capacitor for different applications, compared to a conventional CTIA that may require more than one feedback capacitor for the different applications, an offset removal circuit for the CTIA may be simplified. Furthermore, a low-pass filter may be included with the offset removal circuit in a feedback of the CTIA. By simply adding the first switch 602, second switch 604, capacitor 606, third switch 608 and offset sampling capacitor 610 in the feedback of the CTIA, the offset of the CTIA and noise may be removed, resulting in more accurate offset removal. Circuit area may be reduced because additional offset removal and low-pass filter circuitry may not be needed in parts of the circuit outside of the CTIA and the offset removal and low-pass filtering may be included in the feedback of the CTIA.

Additionally, the low-pass filter advantageously reduces Johnson noise or wideband noise (e.g., due to sensor column parasitics, the bandwidth of this noise is determined by the parasitic resistance and parasitic capacitance of the sensor column) prior to offset sampling to prevent these noises being sampled during offset sampling, further improving the accuracy of offset removal. For example, without the benefit of noise removal, the accuracy of a data converter may be around $1 \times 10^{-15}$ C (e.g., an error between an output and a corresponding input), which may be caused by Johnson noise on the sensor column parasitic capacitance. In contrast, with the benefit of noise removal using the circuits and methods described herein, the accuracy of a data converter with these benefits may achieve an improved accuracy of $1.4 \times 10^{-16}$ C (e.g., an error between an output and a corresponding input). If the input is a 10 pC input (e.g., a total amount of charge being integrated is 10 pC), the improved data converter may achieve 16 effective number of bits (ENOB).

For example, without using the disclosed offset removal circuit and methods, the offset is 4 mV. A low-pass filter and offset removal circuit described with respect to FIG. 6 is added to the feedback of the CTIA with the following parameters: $C_{610}$=0.5 pF, f=2 MHz, $C_{606}$=0.2 pF, $\tau$=1.25 us. With the addition of low-pass filter and offset removal circuit, the offset is reduced to 1.5 mV.

In some embodiments, a resistor is used in place of the switched capacitor circuit (e.g., first switch 602, second switch 604, capacitor 606) to create a low-pass filter with similar benefits described above. For example, referring back to circuit 500 of FIG. 5, a resistor having a suitable resistance value (e.g., to yield a desired cutoff frequency) may be electrically coupled (not shown) to the first switch 502 to create a low-pass filter with similar benefits described above.

Figure 7:
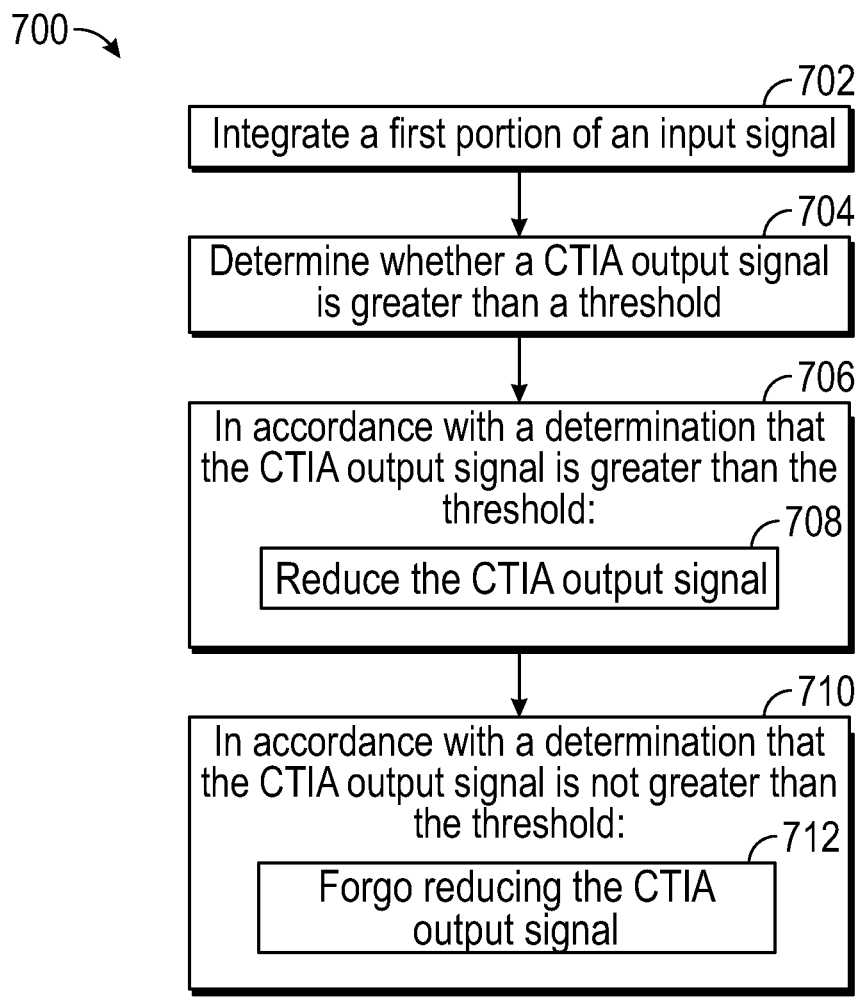
FIG. 7 illustrates an exemplary method, according to embodiments of this disclosure.

FIG. 7 illustrates an exemplary method 700, according to embodiments of this disclosure. In some embodiments, the method 700 is a method of operating the circuit 100, circuit 400, circuit 500, and/or circuit 600. Although the method 700 is illustrated as including the described steps, it is understood that different order of steps, additional steps, or less steps may be performed to operate an exemplary data converter without departing from the scope of the disclosure. Some descriptions and advantages associated with steps of the method 700 are described with respect to FIGS. 1-6 and are not repeated here.

In some embodiments, the method 700 includes integrating, with a CTIA of the circuit, an input signal (step 702). For example, a first portion of the input signal (e.g., input signal 110, input signal 410, input waveform 202) is integrated by the CTIA (e.g., CTIA 102, CTIA 402, circuit 500, circuit 600), as illustrated by the CTIA output waveform 206 between adjacent feedback times 212.

In some embodiments, the method 700 includes reducing a current level of the input signal using a variable resistor. For example, as described with respect to FIG. 1, a variable resistor (e.g., a MOS transistor controlled by a varying voltage to modify the transistor's effective resistance) is electrically coupled to the input of the circuit (e.g., circuit 100, circuit 400) to reduce a current level of the input signal (e.g., to reduce the rate of charging the feedback capacitor and prevent the feedback capacitor from saturating when a high current level causes a high charging rate).

In some embodiments, the method 700 includes electrically coupling a sensor to the CTIA. In some embodiments, the sensor provides the input signal, the CTIA includes a feedback capacitor, and a capacitance of the feedback capacitor is smaller than a capacitance of the sensor. For example, during integration (e.g., integration 308), as described herein, a sensor pixel (e.g., a bolometer pixel, an X-ray sensor pixel, a visible imaging sensor pixel, an infrared imaging sensor pixel, a MEMS sensor pixel, a sensor pixel that converts information about an environment into an electrical signal) is electrically coupled to the CTIA (e.g., CTIA 102, CTIA 402, circuit 500, circuit 600). The sensor pixel provides the input signal (e.g., input signal 110, input signal 410, input waveform 202). The CTIA includes a feedback capacitor (e.g., feedback capacitor 116, feedback capacitor 416, feedback capacitor 516, feedback capacitor 616), and a capacitance of the feedback capacitor (e.g., 0.5 pF in an example) is smaller than a capacitance of the sensor (e.g., 2.6 pF in an example). Some descriptions and advantages associated with the feedback capacitor of the CTIA described with respect to FIGS. 1-6 are not repeated here.

In some embodiments, the method 700 includes determining whether a CTIA output signal at the output of the CTIA is greater than a threshold (step 704). For example, the quantizer (e.g., quantizer 104, quantizer 404) determines whether the CTIA output signal is greater than a threshold (e.g., threshold 218) at quantizer decision times (e.g., 210A-210I).

In some embodiments, the method 700 includes in accordance with a determination that the CTIA output signal is greater than the threshold (step 706): reducing the CTIA output signal (step 708).

For example, the quantizer (e.g., quantizer 104, quantizer 404) determines that the CTIA output signal (e.g., CTIA output waveform 206) is greater than a threshold (e.g., threshold 218) at quantizer decision times (e.g., 210B, 210C, 210D, 210E, 210G). In accordance with this determination, the quantizer (e.g., quantizer 104, quantizer 404) outputs the decision (e.g., a "high" value) to the DAC (e.g., DAC 106, DAC 406), and in response to receiving the quantizer decision, the DAC provides a high DAC output signal, causing a value to be reduced from the CTIA output signal (e.g., using summer 108, using summer 408) during feedback times (e.g., 212B, 212C, 212D, 212E, 212G) (e.g., subtracting, from the CTIA output signal, a fixed value 214).

In some embodiments, the method 700 includes in accordance with a determination that the CTIA output signal is greater than the threshold, generating a high DAC output signal. The CTIA output signal is reduced by a value, and the value is generated based on the high DAC output value. For example, a DAC (e.g., DAC 106, DAC 406) generates the high DAC output signal in accordance with a determination that the CTIA output signal (e.g., output of CTIA 102, output of CTIA 402, output of circuit 500, output of circuit 600) is greater than the threshold (e.g., threshold of a quantizer, threshold 218).

In some embodiments, the CTIA includes a feedback capacitor (e.g., feedback capacitor 116, feedback capacitor 416, feedback capacitor 516, feedback capacitor 616). The feedback capacitor is configured to store a total charge, and the CTIA output signal is reduced by a value corresponding to a value less than the total charge. For example, the fixed value 214 corresponds to a value less than a total charge that the feedback capacitor can store (e.g., the value is not larger than a highest possible level of CTIA output waveform 206).

In some embodiments, the method 700 includes in accordance with a determination that the CTIA output signal is not greater than the threshold (step 710): forgoing reducing the CTIA output signal (step 712).

For example, the quantizer (e.g., quantizer 104, quantizer 404) determines that the CTIA output signal (e.g., CTIA output waveform 206) is not greater than a threshold (e.g., threshold 218) at quantizer decision times (e.g., 210A, 210F, 210H). In accordance with this determination, the quantizer (e.g., quantizer 104, quantizer 404) outputs the decision (e.g., a "low" value) to the DAC (e.g., DAC 106, DAC 406), and in response to receiving the quantizer decision, the DAC forgoes providing a high DAC output signal (e.g., the DAC ceases providing an output) at the input of the circuit. The CTIA output signal is not reduced (e.g., no high DAC output signal is provided to summer 108, no high DAC output signal is provided to summer 408) from the input signal during feedback times (e.g., 212A, 212F).

In some embodiments, integrating the input signal includes integrating a first portion of the input signal, and the method 700 includes integrating, with the CTIA, a second portion of the input signal. For example, after a first portion is integrated (e.g., a portion of the input signal is integrated between adjacent feedback times), the CTIA continues to integrate a second portion of the input signal (e.g., a subsequent portion of the input signal is integrated between the next pair of adjacent feedback times).

In some embodiments, whether the CTIA output signal at the output of the CTIA is greater than the threshold is determined while the first portion is integrating at a first time. For example, referring to FIG. 2, whether the CTIA output signal at the output of the CTIA is greater than the threshold is determined at a quantizer decision time (e.g., quantizer decision times 210A-210I).

In some embodiments, in accordance with a determination that the CTIA output signal is greater than the threshold, the method 700 includes reducing the CTIA output signal at a second time after the first time. Integrating the second portion begins from the reduced CTIA output signal at a third time after the second time. For example, referring to FIG. 2, in accordance with a determination that the CTIA output signal is greater than the threshold at a quantizer time (e.g., quantizer times 210B, 210C, 210D, 210E, 210G) by a quantizer (e.g., quantizer 104, quantizer 404), the CTIA output signal is reduced at a feedback time (a time between e.g., feedback times 212B, 212C, 212D, 212E, 212G), and the integrated second portion begins from the reduced CTIA output signal at a third time (e.g., between feedback times 212B and 212C, between feedback times 212C and 212D, between feedback times 212D and 212E, between feedback times 212G and 212H).

In some embodiments, in accordance with a determination that the CTIA output signal is not greater than the threshold, the method 700 includes forgoing reducing the CTIA output signal at the second time. Integrating the second portion begins from the CTIA output signal at the third time. For example, referring to FIG. 2, in accordance with a determination that the CTIA output signal is not greater than the threshold at a quantizer time (e.g., quantizer times 210A, 210F) by a quantizer (e.g., quantizer 104, quantizer 404), reducing the CTIA output signal is forgone at a feedback time (e.g., feedback times 212A and 212F), and the integrated second portion begins from the CTIA output signal at the third time (a time between e.g., feedback times 212A and 212B and between feedback times 212F and 212G).

In some embodiments, a frequency of operation of the circuit is based on a time between the integration of the input signal, and a sensitivity of the circuit is based on the frequency of operation of the circuit. For example, the frequency of operation of the circuit (e.g., circuit 100, circuit 400) is based on a timing between quantizer decision times (e.g., quantizer decision times 210A-210I) and/or feedback times (e.g., feedback times 212A-212I). Based on the timing between quantizer decision times and/or feedback times, a sensitivity of the circuit is set (e.g., a size of the portion being integrated is set, thereby setting the resolution of the integration). By having sensitivity adjustability based on a frequency of operation, the circuit may be advantageously used for a wider range of applications (e.g., the circuit is suitable for both lower and higher resolution systems).

In some embodiments, when the CTIA output signal is not greater than the threshold and a level of the input signal is zero, the CTIA output signal corresponds to a residue. For example, near the end of integration time (e.g., integration 308), the portion of the input signal (e.g., the portion of CTIA output waveform 206 after feedback time 212G) being integrated is a residue.

In some embodiments, the method 700 includes removing an offset of the CTIA. For example, the offset of the CTIA is removed during offset removal 304. For example, the offset removal circuit 120 captures the offset value. The offset value is reduced from the residue charge or the residue voltage prior to being provided to the ADC 118, removing the offset from the digital output signal 112 and improving the data conversion accuracy of the circuit 100.

In some embodiments, the offset removal circuit 120 is configured for correlated double sampling. After the reset switch 126 resets the feedback capacitor 116 (e.g., after feedback capacitor reset 302), random noise may be sampled. In some embodiments, the capacitance of a sensor column may be large, and the noise may be thermal noise in the parasitic column elements and may cause a random charge value. The standard deviation of this random charge may be approximately equal to $\sqrt{kTC_{data}}$.

In some embodiments, to remove this random noise, the output of the CTIA is measured (e.g., measured multiple times and averaged) by the offset removal circuit 120—once at the start or before the start of integration, measuring the noise charge, and once at the end or after integration completes, measuring an integrated signal or a residue plus the noise charge. The difference of these two measured values (e.g., the difference of these two measured values would exclude the offset) is converted to a digital value using ADC 118 (e.g., a Sigma-Delta converter).

In some embodiments, the offset is removed using an offset removal circuit included in a feedback of the CTIA. For example, the offset removal circuit included in circuit 500 or circuit 600 removes the CTIA offset using the methods described with respect to FIGS. 5 and 6.

In some embodiments, the method 700 includes low-pass filtering the offset of the CTIA. In some embodiments, a low-pass filter is included in a feedback of the CTIA to low-pass filter the offset of the CTIA. For example, as described with respect to FIG. 5, a resistor (not shown) having a desired resistance (e.g., to achieve a particular cutoff frequency of the filter) is electrically coupled to the first switch 502 to filter out noise associated with the offset. As another example, as described with respect to FIG. 6, a switched capacitor circuit (e.g., first switch 602, second switch 604, capacitor 606) having a desired effective resistance (e.g., to achieve a particular cutoff frequency of the filter) is included in the feedback of circuit 600 to filter out noise associated with the offset.

In some embodiments, removing the offset of the CTIA further includes converting the offset of the CTIA into a digital value of the offset. For example, as described with respect to FIG. 4, the offset is converted into a digital value using ADC 418, and the digital value of the offset is removed from the digital output signal 412, removing the effects of the CTIA offset during conversion of the input signal.

In some embodiments, converting the offset of the CTIA further includes scaling the offset of the CTIA. For example, as described with respect to FIG. 4, prior to converting the offset into a digital value using ADC 418 and removing the digital value of the offset from the digital output signal 412, the offset of the CTIA is scaled (e.g., amplified) using resistors 428 and 430 to increase a current being inputted to the ADC 418 and reduce a sensitivity requirement of the ADC to convert the offset.

In some embodiments, the method 700 includes generating a digital output signal corresponding to the input signal. For example, the circuit 100 generates a digital output signal 112, or the circuit 400 generates a digital output signal 412. The digital output signal is based on an output of the quantizer (e.g., a binary sequence based on the comparison results between the CTIA output and a quantizer threshold (e.g., quantizer output waveform 208)).

In some embodiments, the input signal is a charge at an input of the circuit, and the digital output signal is a digital value of the charge. In some embodiments, the input signal is a current at an input of the circuit, and the digital output signal is a digital value of the current. In some embodiments, the input signal is a voltage at an input of the circuit, and the digital output signal is a digital value of the voltage.

In some embodiments, in accordance with the determination that the CTIA output signal is not greater than the threshold, the method 700 includes determining whether a readout of the input signal has completed. In accordance with a determination that the readout of the input signal has completed, the method 700 includes outputting the CTIA output signal as a residue. In accordance with a determination that the readout of the input signal has not completed, the method 700 includes forgoing outputting the CTIA output signal as the residue.

For example, referring to FIG. 2, at the eighth feedback time 212H, the value of the input waveform 202 is reduced to zero (e.g., an electrically coupled sensor finishes discharging, readout for an electrically coupled sensor is completed). In accordance with a determination that the readout of the input signal has completed, after the eighth feedback time 212H, the feedback capacitor ceases charging and causes the output of the CTIA to become a constant value. This constant output of the CTIA 102 after the eighth feedback time 212H is the residue (e.g., residue 216, the residue voltage, the voltage corresponding to the residue charge). Prior to the eighth feedback time 212H, in accordance with a determination that the readout of the input signal has not completed, the circuit (e.g., circuit 100, circuit 400) forgoes outputting the CTIA output signal as the residue.

In some embodiments, the input signal is integrated at a first time. For example, referring to FIG. 2, the input signal 202 is integrated at a time between two of the feedback times 212A-212H. In some embodiments, whether the readout of the input signal has completed is determined at a second time after the first time. In accordance with the determination that the readout of the input signal has completed, the CTIA output signal is outputted as a residue at a third time after the second time. For example, referring to FIG. 2, whether the readout of the input signal has completed is determined at feedback time 212H. At the feedback time 212H, the readout of the input signal is determined to be completed (e.g., an electrically coupled sensor finishes discharging, readout for an electrically coupled sensor is completed). After the feedback time 212H, the feedback capacitor ceases charging and causes the output of the CTIA to become a constant value. This constant output of the CTIA 102 after the eighth feedback time 212H is the residue (e.g., residue 216, the residue voltage, the voltage corresponding to the residue charge).

In some embodiments, in accordance with a determination that the readout of the input signal has not completed, outputting the CTIA output signal as the residue is forgone. For example, referring to FIG. 2, whether the readout of the input signal has completed is determined prior to feedback time 212H. Prior to feedback time 212H, the readout of the input signal is determined to not be completed (e.g., an electrically coupled sensor is discharging, readout for an electrically coupled sensor is being performed), and the circuit (e.g., circuit 100, circuit 400) forgoes outputting the CTIA output signal as the residue.

In some embodiments, the digital output signal is further based on a residue. For example, the digital output signal (e.g., digital output signal 112, digital output signal 412) is based on the output of the quantizer and the residue of the CTIA (e.g., CTIA 102, CTIA 402); the output of the quantizer and the residue of the CTIA (or a digital value of the residue) are provided to the FIR decimator (e.g., FIR decimator 122, FIR decimator 422) to generate the digital output signal.

In some embodiments, the method 700 includes generating a binary sequence and providing the binary sequence to a FIR decimator. The digital output signal is generated by a FIR decimator, and the binary sequence is based on the determination whether the CTIA output signal at the output of the CTIA is greater than the threshold. In some embodiments, generating the binary sequence further includes in accordance with the determination that the CTIA output signal is greater than the threshold, outputting a first binary value; and in accordance with the determination that the CTIA output signal is not greater than the threshold, outputting a second binary value. For example, the digital output signal (e.g., digital output signal 112, digital output signal 412) is based on the output of the quantizer. In some embodiments, in accordance with the determination that the CTIA output signal is greater than the threshold, the quantizer outputs a high digital value. In accordance with the determination that the CTIA output signal is not greater than the threshold, the quantizer outputs a low digital value. The output of the quantizer is provided to the FIR decimator (e.g., FIR decimator 122, FIR decimator 422) to generate the digital output signal.

In some embodiments, the method 700 includes providing a digital value of a residue to the FIR decimator. The digital output signal is further based on the digital value of the residue. For example, the digital output signal (e.g., digital output signal 112, digital output signal 412) is based on the output of the quantizer and the residue of the CTIA (e.g., CTIA 102, CTIA 402); the output of the quantizer and a digital value of the residue are provided to the FIR decimator (e.g., FIR decimator 122, FIR decimator 422) to generate the digital output signal.

In some embodiments, the method 700 includes generating a digital value of the residue. For example, the CTIA output signal is the residue, and an ADC (e.g., ADC 118, ADC 418) generates a digital value of the residue (e.g., and provides the digital value of the residue to a FIR decimator). In some embodiments, the digital value of the residue is generated using a Sigma-Delta ADC (e.g., ADC 118 is Sigma-Delta ADC, ADC 418 is a Sigma-Delta ADC).

In some embodiments, the method 700 includes determining coefficients associated with the FIR decimator using at least one of an analytical determination, a simulation-based numerical determination, and a measurement-based numerical determination. Examples of determining coefficients associated with the FIR decimator (e.g., FIR decimator 122, FIR decimator 422) and their advantages are described with respect to FIG. 1. These examples are not repeated here.

In some embodiments, the method 700 includes operating the circuit as a MASH modulator. In response to operating the circuit as a MASH modulator, forgoing determining whether a CTIA output signal at the output of the CTIA is greater than a threshold. For example, as described with respect to FIG. 1, in response to operating the circuit as a MASH modulator, the quantizer 104 is turned off while an input signal continues to be integrated.

By integrating portions of the input signal at different times and reducing the CTIA output by a value after integrating a portion, the CTIA is allowed to advantageously integrate adaptively. As an exemplary advantage, the disclosed circuits and methods of operating the circuits may allow the feedback capacitance value to be smaller, compare to a feedback capacitor of a CTIA that conventionally integrates (e.g., associated with conventional CTIA output waveform 204). The CTIA with a smaller feedback capacitor may be able to integrate a same input as the conventional CTIA with the bigger feedback capacitor. Accordingly, a corresponding output voltage may be higher (e.g., due to the Q=CV relationship), relaxing the resolution or sensitivity requirements of subsequent circuitry (e.g., an ADC). As another exemplary advantage, because the CTIA is allowed to integrate adaptively, the disclosed circuits and methods of operating the circuits may accommodate readout of different array sizes, different kind of pixels, and/or different dynamic ranges, reducing a need for different CTIA designs and reducing cost for designing specific readout circuits.

Furthermore, because the feedback capacitor of the CTIA does not saturate while being integrated as described (e.g., as a result of operating the circuits using the disclosed methods), the feedback capacitor of the CTIA may be used to integrate charge beyond the storage capacity of an equivalent feedback capacitor of a conventional CTIA. In some embodiments, an effective capacitance of the CTIA feedback capacitor (e.g., corresponding to a total number of charge that the CTIA feedback capacitor can integrate during integration) may be determined based on the clock that controls the quantizer (e.g., quantizer 104, quantizer 404). For example, if there are $N_1$ cycles available for use by the CTIA (e.g., there are $N_1$ number quantizer decision times 210 during integration, there are $N_1$ number feedback times 212 during integration), the effective capacitance of the CTIA feedback capacitor is $N_1 \times$(capacitance of the CTIA feedback capacitor). In some embodiments, the number $N_1$ is determined based on a total number of oversampling ratio (OSR) clock cycles N and on how the N clock cycles are allocated between the integration time (e.g., integration 308) and the residue conversion (e.g., residue conversion portion of residue conversion and FIR output 310). As an example, $N_1=16$ and the capacitance of the feedback capacitor of the CTIA is 0.5 pF, the effective capacitance of the CTIA feedback capacitor is 16×0.5 pF=8 pF, meaning that, a CTIA including a 0.5 pF feedback capacitor may have three times the charge capacity, compared to a conventional CTIA that includes a 2.6 pF feedback capacitor.

Furthermore, because the CTIA is allowed to integrate adaptively, the CTIA (e.g., CTIA 102, CTIA 402, circuit 500, circuit 600) may be configured for variable gain by varying integration time, reducing a need for additional feedback capacitors for different gains. Additionally, by integrating as described, portions of the input may be converted at a same time (e.g., a first portion of the input is converted after being integrated while a second portion of the input is being integrated), reducing a need for sample and hold circuits and additional capacitors without reducing conversion speed.

The area efficiency and flexibility of the disclosed circuits (e.g., enabled by operating the circuits using the disclosed methods) may be advantageously suited for arrayed sensors such as X-ray, visible and infrared imaging, and MEMS sensors, where sets of signals may be readout and converted to digital form. Without changing the hardware, the disclosed circuits advantageously can be configured to convert data for different array sizes, different kind of sensors, or different dynamic ranges (e.g., by adjusting integration time) while maintaining an accuracy of a corresponding data conversion circuit that conventionally integrates.

As yet another exemplary advantage, the effects of thermal noise (e.g., from sensor column parasitic capacitance) on the disclosed circuits may be lower due to the Sigma-Delta oversampling (e.g., by integrating, as described herein; by using a Sigma-Delta converter for ADC 118) performed by the disclosed circuits, compared to a higher bandwidth sample and hold circuit used to capture an output of a conventional CTIA.

In some embodiments, a non-transitory computer readable storage medium stores one or more programs, and the one or more programs includes instructions. When the instructions are executed by an electronic device (e.g., an electronic device including a circuit described herein) with one or more processors and memory, the instructions cause the electronic device to perform the methods described with respect to FIGS. 1-7.

Although the disclosed circuits are described with the illustrated elements, it is understood that the illustration is merely exemplary. Different elements or additional elements may be added or removed from the disclosed circuits to form the disclosed data converter. The described elements may also be electrically coupled or configured differently than illustrated. For example, although some of the circuits are illustrated as being single-ended circuits, it is understood that the disclosed circuits may be configured for differential signaling.

Figure 8:
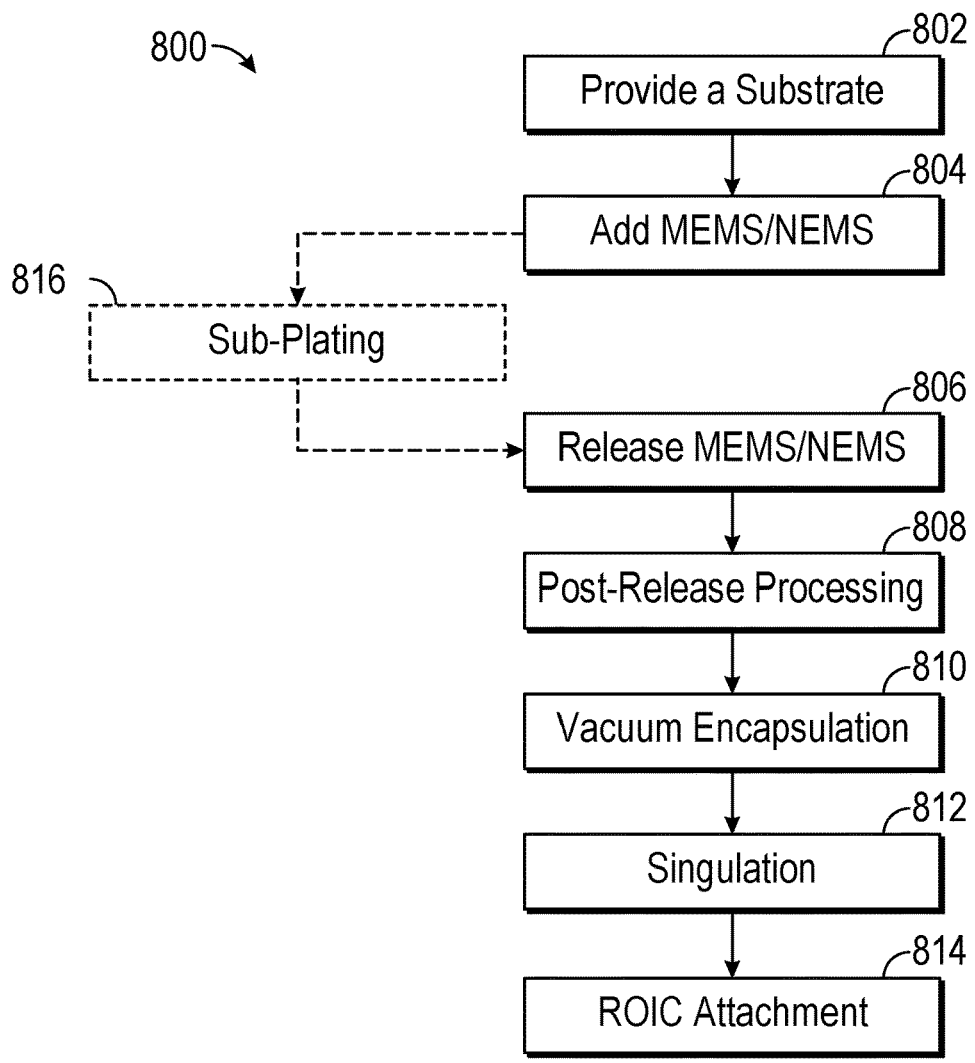
FIG. 8 illustrates a method of manufacturing a MEMS system, in accordance with an embodiment.

FIG. 8 illustrates a method 800 of manufacturing an electromechanical system, in accordance with an embodiment. As non-limiting examples, the electromechanical system could be associated with circuits 100, 400, 500, or 600 (and/or related methods) (e.g., circuits 100, 400, 500, or 600 are included in a readout circuit of the electromechanical system). To manufacture an electromechanical system, all or some of the process steps in method 800 could be used and used in a different order. As a non-limiting example, Step 814 could be performed before Step 812.

Method 800 includes Step 802, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle, which produces an alkaline earth boro aluminosilicate (a silicate loaded with boron, aluminum, and various alkaline earth elements). Other variations are available from Asahi Glass or Schott.

In some embodiments, a flat panel glass process is used to manufacture the electromechanical system. In some embodiments, a liquid crystal display (LCD) process is used to manufacture the electromechanical system. In some embodiments, an OLED display process or an x-ray panel process is used. Employing a flat panel glass process may allow for increased substrate sizes, thereby allowing for a higher number of electromechanical systems per substrate, which reduces processing costs. "Panel level" sizes can include 300 mm×400 mm, 360 mm×465 mm, 400 mm×500 mm, 550 mm×650 mm, 620 mm×750 mm, 680 mm×880 mm, 730 mm×920 mm, 1100 mm×1300 mm, 1300 mm×1500 mm, 1500 mm×1850 mm, 1950 mm×2250 mm, 2200 mm×2500 mm, and 2840 mm×3370 mm. Further, thin film transistors (TFTs) in panel level manufacturing can also reduce cost and so, for example, LCD-TFT processes can be beneficial.

Some embodiments may include attachment of a readout integrated circuit (ROIC), which may include circuits 100, 400, 500, and/or 600, and flex/PCB attachment. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed to meet requirements for sensing a specific electromagnetic wavelength (such as X-Rays, THz, LWIR).

In some embodiments, the MEMS devices manufactured by processes herein are bolometers, each including a glass substrate and a bolometer pixel coupled to the structure. In some embodiments, a bolometer includes a MEMS or NEMS device manufactured by an LCD-TFT manufacturing process.

Bolometers can be used in a variety of applications. For example, long wave infra-red (LWIR, wavelength of approximately 8-14 μm) bolometers can be used in the automotive and commercial security industries. For example, LWIR bolometers with QVGA, VGA, and other resolution. Terahertz (THz, wavelength of approximately 0.1 to 1.0 mm) bolometers can be used in security (e.g., airport passenger security screening) and medical (medical imaging). For example, THz bolometers can have the QVGA resolution (320×240) or other resolutions. Some electromechanical systems can include X-Ray sensors or camera systems. Similarly, LWIR and THz sensors are used in camera systems. Some electromechanical systems are applied in medical imaging, such as endoscopes and exoscopes.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

As used herein, the term "MEMS" can be understood to include electromechanical systems having sizes of approximately 1 mm and below. For example, the term "MEMS" can be understood to include nano electromechanical systems ("NEMS").

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims. For example, although this disclosure is primarily described with respect to glass MEMS plates/panels, one of skill in the art will recognize that other MEMS plates/panels could also be used without deviating from the scope of the disclosure. Such others MEMS plates may include, but are not limited to, organic materials (plastics, polymers) and metals (e.g., stainless steel). As used herein, the terms "plate" and "panel" are synonymous.

Method 800 includes Step 804, adding MEMS to the substrate. Although MEMS is used to describe the addition of structures, it should be appreciated that other structures could be added without deviating from the scope of this disclosure. In some embodiments using panel level processing, the MEMS structures may be added using an LCD-TFT process.

Step 804 may be followed by optional Step 816, sub-plating. Step 816 may be used when the substrate is larger than the processing equipment used in subsequent steps. For example, if using a panel level process (such as LCD), some embodiments will include (at Step 804) cutting the panel into wafer sizes to perform further processing (using, for example, CMOS manufacturing equipment). In other embodiments, the same size substrate is used throughout method 800 (i.e., Step 816 is not used).

Method 800 includes Step 806, releasing the MEMS from the substrate.

Method 800 includes Step 808, post-release processing. Such post-release processing may prepare the MEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 800 includes Step 810, vacuum encapsulation of the MEMS structure, where necessary. Vacuum encapsulation may be beneficial to prolong device life.

Method 800 includes Step 812, singulation. Some embodiments may include calibration and chip programming (e.g., of circuits 100, 400, 500, and/or 600), which may take into account the properties of the sensors. Methods described herein may be advantageous in glass substrate manufacturing processes because uniformity in glass lithography capabilities is limited. As a further advantage, glass has a lower thermal conductivity and so a glass substrate can be a better thermal insulator; by manufacturing thin structures separating a bolometer pixel from a glass substrate, embodiments herein may better serve to thermally isolate the glass bolometer pixel from the packaging environment.

Method 800 includes Step 814, attachment of a readout integrated circuit (ROIC), which may include circuits 100, 400, 500, and/or 600, and flex/PCB attachment. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed for sensing a specific electromagnetic wavelength (such as X-Rays, THz, LWIR).

Figure 9:
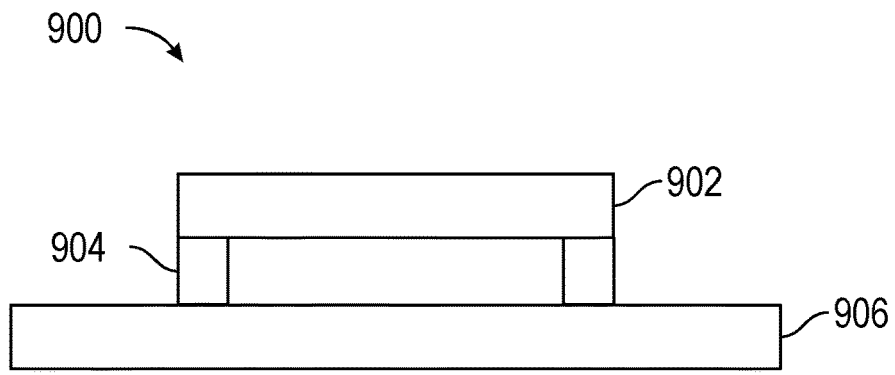
FIG. 9 illustrates an exemplary sensor.

FIG. 9 illustrates an exemplary sensor. In some embodiments, sensor 900 is manufactured using method 800. In some embodiments, the sensor 900 is readout using circuits 100, 400, 500, and/or 600.

In some embodiments, a sensor includes a glass substrate, a structure manufactured from any of the methods described herein and coupled to the glass substrate, and a sensor pixel coupled to the structure.

In some embodiments, a sensor includes a MEMS or NEMS device manufactured by a LCD-TFT manufacturing process and a structure manufactured by any of the methods described herein.

By way of examples, sensors can include resistive sensors and capacitive sensors. Bolometers can be used in a variety of applications. For example, long wave infrared (LWIR, wavelength of approximately 8-14 μm) bolometers can be used in the automotive and commercial security industries. For example, LWIR bolometers with QVGA, VGA, and other resolution. terahertz (THz, wavelength of approximately 0.1-3 mm) bolometers can be used in security (e.g., airport passenger security screening) and medical (medical imaging). For example, THz bolometers with QVGA resolution and other resolutions. Some electromechanical systems can include X-Ray sensors or camera sensor systems. Similarly, LWIR and THz sensors are used in camera sensor systems. Some electromechanical systems are applied in medical imaging, such as endoscopes and exoscopes. X-ray sensors include direct and indirect sensing configurations.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

In one aspect, a circuit includes: an analog input, a charge transimpedance amplifier (CTIA) electrically coupled to the analog input, a quantizer electrically coupled to an output of the CTIA, a digital-to-analog converter (DAC) electrically coupled to an output of the quantizer, a summer electrically coupled to an output of the DAC. The CTIA is electrically coupled to an output of the summer, a digital filter electrically coupled to the output of the quantizer, and a digital output electrically coupled to the digital filter.

In some aspects of the above circuit, the CTIA includes a feedback capacitor, the analog input is electrically coupled to a sensor, and a capacitance of the feedback capacitor is smaller than a capacitance of the sensor.

In some aspects of the above circuits, the summer is configured to cause a CTIA output signal to be reduced in response to receiving a high DAC output signal at the output of the DAC.

In some aspects of the above circuits, the summer is further configured to cause the CTIA output signal to be reduced by a value in response to receiving the high DAC output signal at the output of the DAC.

In some aspects of the above circuits, the CTIA includes a feedback capacitor, the feedback capacitor is configured to store a total charge, and the value corresponds to a charge less than the total charge.

In some aspects of the above circuits, the quantizer is configured to: determine whether a CTIA output signal at the output of the CTIA is greater than a threshold; in accordance with a determination that the CTIA output signal is greater than the threshold, output a first digital value to the DAC; and in accordance with a determination that the CTIA output signal is not greater than the threshold, output a second digital value to the DAC, and the DAC is configured to: in response to receiving the first digital value, output a high DAC output signal to the summer; and in response to receiving the second digital value, forgo outputting the high DAC output signal to the summer.

In some aspects of the above circuits, the circuits further include an analog-to-digital converter (ADC) electrically coupled to the output of the CTIA. The ADC is configured to: receive a voltage corresponding to a residue charge at the output of the CTIA; and provide a digital value corresponding to the residue charge. The digital output includes the digital value corresponding to the residue charge.

In some aspects of the above circuits, the voltage corresponding to the residue charge is less than a threshold of the quantizer.

In some aspects of the above circuits, the ADC is a Sigma-Delta ADC.

In some aspects of the above circuits, the circuits further include an offset removal circuit. The offset removal circuit is configured to remove an offset from a CTIA output signal.

In some aspects of the above circuits, the offset removal circuit is included in a feedback of the CTIA.

In some aspects of the above circuits, an ADC is configured to convert an offset from a CTIA output signal into a digital value of the offset.

In some aspects of the above circuits, the offset from the CTIA output signal is scaled, and the scaled offset is provided to the ADC.

In some aspects of the above circuits, the circuits further include a low-pass filter included in a feedback of the CTIA.

In some aspects of the above circuits, a sensitivity of the circuit is based on a frequency of operation of the circuit, and the frequency of operation of the circuit is based on an integration time of the CTIA.

In some aspects of the above circuits, a digital output signal at the digital output is a digital value of a charge at the analog input of the circuit.

In some aspects of the above circuits, a digital output signal at the digital output is a digital value of a current at the analog input of the circuit.

In some aspects of the above circuits, a digital output signal at the digital output is a digital value of a voltage at the analog input of the circuit.

In some aspects of the above circuits, the circuit further includes a variable resistor electrically coupled to the analog input. The variable resistor is configured to reduce a signal level of an input signal at the analog input of the circuit.

In some aspects of the above circuits, the digital filter includes a Finite Impulse Response (FIR) decimator. The FIR decimator is configured to generate a digital output signal at the digital output based on the signals received from the output of the quantizer.

In some aspects of the above circuits, the FIR decimator is configured to further receive a digital value corresponding to a residue charge at the output of the CTIA, and the FIR decimator is configured to generate the digital output signal further based on the digital value corresponding to the residue charge at the output of the CTIA.

In some aspects of the above circuits, coefficients associated with the FIR decimator are determined using at least one of an analytical determination, a simulation-based numerical determination, and a measurement-based numerical determination.

In some aspects of the above circuits, the quantizer and the DAC are included in a combined quantizer and DAC of the circuit.

In one aspect, a method includes: integrating, with a CTIA of a circuit, an input signal; determining whether a CTIA output signal at the output of the CTIA is greater than a threshold; in accordance with a determination that the CTIA output signal is greater than the threshold: reducing the CTIA output signal; and in accordance with a determination that the CTIA output signal is not greater than the threshold: forgoing reducing the CTIA output signal.

In some aspects of the above method, the method further includes: electrically coupling a sensor to the CTIA. The sensor provides the input signal, the CTIA includes a feedback capacitor, and a capacitance of the feedback capacitor is smaller than a capacitance of the sensor.

In some aspects of the above methods, the methods further include generating a digital output signal corresponding to the input signal.

In some aspects of the above methods, the input signal is a charge at an analog input of the circuit, and the digital output signal is a digital value of the charge.

In some aspects of the above methods, the input signal is a current at an analog input of the circuit, and the digital output signal is a digital value of the current.

In some aspects of the above methods, the input signal is a voltage at an analog input of the circuit, and the digital output signal is a digital value of the voltage.

In some aspects of the above methods, the digital output signal is further based on a residue.

In some aspects of the above methods, the digital output signal is generated by a digital filter.

In some aspects of the above methods, the digital output signal is generated by a FIR decimator. The method further includes: generating a binary sequence; and providing the binary sequence to the FIR decimator. Generating the binary sequence further includes: in accordance with the determination that the CTIA output signal is greater than the threshold, outputting a first binary value; and in accordance with the determination that the CTIA output signal is not greater than the threshold, outputting a second binary value.

In some aspects of the above methods, the methods further includes providing a digital value of a residue to the FIR decimator. The digital output signal is further based on the digital value of the residue.

In some aspects of the above methods, the method further includes determining coefficients associated with the FIR decimator using at least one of an analytical determination, a simulation-based numerical determination, and a measurement-based numerical determination.

In some aspects of the above methods, integrating the input signal includes integrating a first portion of the input signal, and the methods further include integrating, with the CTIA, a second portion of the input signal.

In some aspects of the above methods, whether the CTIA output signal at the output of the CTIA is greater than the threshold is determined while the first portion is integrating at a first time. The methods further include: in accordance with a determination that the CTIA output signal is greater than the threshold: reducing the CTIA output signal at a second time after the first time, integrating the second portion begins at a third time after the second time, and in accordance with a determination that the CTIA output signal is not greater than the threshold: forgoing reducing the CTIA output signal at the second time, integrating the second portion begins at the third time.

In some aspects of the above methods, a frequency of operation of the circuit is based on a time of the integration of the input signal, and a sensitivity of the circuit is based on the frequency of operation of the circuit.

In some aspects of the above methods, when the CTIA output signal is not greater than the threshold and a level of the input signal is zero, the CTIA output signal corresponds to a residue.

In some aspects of the above methods, the methods further include generating a digital value of the residue.

In some aspects of the above methods, the digital value of the residue is generated using a Sigma-Delta ADC.

In some aspects of the above methods, the methods further include in accordance with the determination that the CTIA output signal is greater than the threshold, generating a high DAC output signal. The CTIA output signal is reduced by a value, and the value is generated based on the high DAC output value.

In some aspects of the above methods, the methods further include in accordance with the determination that the CTIA output signal is not greater than the threshold, forgoing generating a high DAC output signal.

In some aspects of the above methods, the CTIA includes a feedback capacitor, the feedback capacitor is configured to store a total charge, and the CTIA output signal is reduced by a value less than the total charge.

In some aspects of the above methods, the methods further include removing an offset of the CTIA.

In some aspects of the above methods, the offset is removed prior to integrating the input signal.

In some aspects of the above methods, the offset is removed using an offset removal circuit included in a feedback of the CTIA.

In some aspects of the above methods, removing the offset of the CTIA further includes converting the offset of the CTIA into a digital value of the offset.

In some aspects of the above methods, converting the offset of the CTIA further includes scaling the offset of the CTIA.

In some aspects of the above methods, the methods further include low-pass filtering the offset of the CTIA.

In some aspects of the above methods, a low-pass filter included in a feedback of the CTIA low-pass filters the offset of the CTIA.

In some aspects of the above methods, the methods further include reducing a current level of the input signal using a variable resistor.

In some aspects of the above methods, in accordance with the determination that the CTIA output signal is not greater than the threshold, the methods further include: determining whether a readout of the input signal has completed; in accordance with a determination that the readout of the input signal has completed, outputting the CTIA output signal as a residue; and in accordance with a determination that the readout of the input signal has not completed, forgoing outputting the CTIA output signal as the residue.

In some aspects of the above methods, the input signal is integrated at a first time, whether the readout of the input signal has completed is determined at a second time after the first time, in accordance with the determination that the readout of the input signal has completed, the CTIA output signal is outputted as a residue at a third time after the second time, and in accordance with a determination that the readout of the input signal has not completed, outputting the CTIA output signal as the residue is forgone.

In some aspects of the above methods, the methods further include, prior to integrating the input signal, resetting a feedback capacitor of the CTIA.

In some aspects of the above methods, the methods further include: operating the circuit as a multi-stage noise-shaping (MASH) modulator; and in response to operating the circuit as a MASH modulator, forgoing determining whether a CTIA output signal at the output of the CTIA is greater than a threshold.

In one aspect, a non-transitory computer readable storage medium stores one or more programs, the one or more programs include instructions, which when executed by an electronic device with one or more processors and memory, cause the device to perform any of the above methods.

Although "electrically coupled" and "coupled" are used to describe the electrical connections between two elements of a circuit in this disclosure, it is understood that the electrical connections do not necessarily need direct connection between the terminals of the components being coupled together. Different combinations and connections of the recited components can achieve electrical coupling without departing from the scope of this disclosure. For example, electrical routing connects between the terminals of the components being electrically coupled together. In another example, a closed (conducting) switch is connected between the terminals of the components being coupled together. In yet another example, additional elements connect between the terminals of the components being coupled together without affecting characteristics of the circuit. For example, buffers, amplifiers, and passive circuit elements can be added without affecting the characteristics of the readout circuit and departing from the scope of this disclosure.

Similarly, when two elements of a circuit are described to be electrical disconnected in this disclosure, it is understood that electrical disconnects do not necessarily need to be physically open between the terminals of the components being switched. It is also understood that the disconnect is not limited to mean prevention of electrical energy transfer between two elements. For example, high-impedance elements are connected between the terminals of the components being uncoupled. In another example, an opened (non-conducting) switch is connected between the terminals of the components being uncoupled, effectively uncoupling the components.

Although some elements or quantities are described in an absolute sense without the term "substantially", it is understood that these elements and quantities can have qualities that are functionally equivalent to the absolute descriptions. For example, in some embodiments, a factor is described as being three. However, it is understood that the factor can be greater or less than three, as long as the ratio is within a tolerance of the system (e.g., accuracy requirements, etc.).

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The invention claimed is:

1. A circuit, comprising:
   an analog input electrically coupled to a sensor;
   a charge transimpedance amplifier (CTIA) electrically coupled to the analog input,
   wherein the CTIA comprises a feedback capacitor, and
   wherein a capacitance of the feedback capacitor is smaller than a capacitance of the sensor;
   a quantizer electrically coupled to an output of the CTIA;
   a digital-to-analog converter (DAC) electrically coupled to an output of the quantizer;
   a summer electrically coupled to an output of the DAC, wherein the CTIA is electrically coupled to an output of the summer;
   a digital filter electrically coupled to the output of the quantizer; and
   a digital output electrically coupled to the digital filter.

2. The circuit of claim 1, wherein the summer is configured to cause a CTIA output signal to be reduced in response to receiving a high DAC output signal at the output of the DAC.

3. The circuit of claim 1, wherein:
the quantizer is configured to:
determine whether a CTIA output signal at the output of the CTIA is greater than a threshold;
in accordance with a determination that the CTIA output signal is greater than the threshold, output a first digital value to the DAC; and
in accordance with a determination that the CTIA output signal is not greater than the threshold, output a second digital value to the DAC, and the DAC is configured to:
in response to receiving the first digital value, output a high DAC output signal to the summer; and
in response to receiving the second digital value, forgo outputting the high DAC output signal to the summer.

4. The circuit of claim 1, further comprising an analog-to-digital converter (ADC) electrically coupled to the output of the CTIA, wherein:
the ADC is configured to:
receive a voltage corresponding to a residue charge at the output of the CTIA; and
provide a digital value corresponding to the residue charge, and
the digital output includes the digital value corresponding to the residue charge.

5. The circuit of claim 1, further comprising an offset removal circuit, wherein the offset removal circuit is configured to remove an offset from a CTIA output signal.

6. The circuit of claim 1, wherein an ADC is configured to convert an offset from a CTIA output signal into a digital value of the offset.

7. The circuit of claim 1, further comprising a low-pass filter included in a feedback of the CTIA.

8. The circuit of claim 1, wherein:
a sensitivity of the circuit is based on a frequency of operation of the circuit, and
the frequency of operation of the circuit is based on an integration time of the CTIA.

9. The circuit of claim 1, wherein a digital output signal at the digital output is a digital value of a charge at the analog input of the circuit.

10. The circuit of claim 1, wherein a digital output signal at the digital output is a digital value of a current at the analog input of the circuit.

11. The circuit of claim 1, wherein a digital output signal at the digital output is a digital value of a voltage at the analog input of the circuit.

12. The circuit of claim 1, further comprising a variable resistor electrically coupled to the analog input, wherein the variable resistor is configured to reduce a signal level of an input signal at the analog input of the circuit.

13. The circuit of claim 1, wherein the digital filter includes a Finite Impulse Response (FIR) decimator, wherein:
the FIR decimator is configured to generate a digital output signal at the digital output based on the signals received from the output of the quantizer.

14. The circuit of claim 1, wherein the quantizer and the DAC are included in a combined quantizer and DAC of the circuit.

15. A method, comprising:
integrating, with a CTIA of a circuit, an input signal;
determining whether a CTIA output signal at the output of the CTIA is greater than a threshold;
in accordance with a determination that the CTIA output signal is greater than the threshold:
reducing the CTIA output signal; and
in accordance with a determination that the CTIA output signal is not greater than the threshold:
forgoing reducing the CTIA output signal.

16. The method of claim 15, further comprising:
electrically coupling a sensor to the CTIA, wherein:
the sensor provides the input signal,
the CTIA comprises a feedback capacitor, and
a capacitance of the feedback capacitor is smaller than a capacitance of the sensor.

17. The method of claim 15, further comprising generating a digital output signal corresponding to the input signal.

18. The method of claim 17, wherein:
the input signal is a charge at an analog input of the circuit, and
the digital output signal is a digital value of the charge.

19. A non-transitory computer readable storage medium storing one or more programs, the one or more programs comprising instructions, which when executed by an electronic device with one or more processors and memory, cause the device to perform a method comprising:
integrating, with a CTIA of a circuit, an input signal;
determining whether a CTIA output signal at the output of the CTIA is greater than a threshold;
in accordance with a determination that the CTIA output signal is greater than the threshold:
reducing the CTIA output signal; and
in accordance with a determination that the CTIA output signal is not greater than the threshold:
forgoing reducing the CTIA output signal.

\* \* \* \* \*